(12) United States Patent
Hosono et al.

(10) Patent No.: US 6,550,050 B2
(45) Date of Patent: Apr. 15, 2003

(54) METHOD OF DESIGNING SEMICONDUCTOR INTEGRATED CIRCUIT DEVICE, AND APPARATUS FOR DESIGNING THE SAME

(75) Inventors: Toshikatsu Hosono, Kasugai (JP); Takashi Yoneda, Kasugai (JP); Miyako Fujita, Kasugai (JP); Makoto Wakita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/799,640

(22) Filed: Mar. 7, 2001

(65) Prior Publication Data

US 2002/0049957 A1 Apr. 25, 2002

(30) Foreign Application Priority Data

Oct. 5, 2000 (JP) .......................................... 2000-306216

(51) Int. Cl.[7] .............................................. G06F 17/50
(52) U.S. Cl. ................................. 716/13; 716/5; 716/4; 716/10
(58) Field of Search ........................... 716/13, 5, 4, 10, 716/1

(56) References Cited

U.S. PATENT DOCUMENTS

| | | | | |
|---|---|---|---|---|
| 5,379,232 A | * | 1/1995 | Komoda | ................ 703/15 |
| 6,026,225 A | * | 2/2000 | Iwasaki | ................ 716/10 |
| 6,080,206 A | * | 6/2000 | Tadokoro et al. | .......... 716/10 |
| 6,205,570 B1 | * | 3/2001 | Yamashita | ................ 716/1 |
| 6,253,359 B1 | * | 6/2001 | Cano et al. | ................ 716/5 |
| 2002/0077798 A1 | * | 6/2002 | Inoue et al. | ............... 703/19 |

FOREIGN PATENT DOCUMENTS

| JP | 02000276501 | * 10/2000 | ........... G06F/17/50 |
|---|---|---|---|

* cited by examiner

Primary Examiner—Vuthe Siek
Assistant Examiner—Magid Y Dimyan
(74) Attorney, Agent, or Firm—Staas & Halsey LLP

(57) ABSTRACT

In a method of and an apparatus for designing a semiconductor integrated circuit device, which are capable of causing each waveform rounding to fall within a predetermined limit value without delay calculations at an early stage of the development of the semiconductor integrated circuit device, a wiring path resistance Rpath from an output terminal of a target circuit cell to a next-stage circuit cell and an allowable longest wiring resistance RtL drivable by the target circuit cell are compared. When Rpath is less than or equal to RtL (S4: YES), the sum Rtotal of resistances of wiring loads in a net and RtL are compared. If Rtotal is less than or equal to RtL (S5: YES), then the next-stage circuit cell is judged to be drivable within a predetermined waveform rounding limit value. When Rtotal is greater than RtL (S5: NO), an effective resistance Rw of each wiring load and an allowable longest wiring effective resistance RwL are compared. When Rw is less than or equal to RwL (S6: YES), the waveform rounding at the next-stage circuit cell is judged to fall within a predetermined limit value.

18 Claims, 14 Drawing Sheets

CONVENTIONAL CIRCUIT CELL LAYOUT CONTROL FLOW

CONCEPTUAL DIAGRAM ILLUSTRATING CORRELATION
BETWEEN WAVEFORM ROUNDINGS AND WIRING TOPOLOGIES
WHEN TOTAL WIRING LENGTHS ARE EQUAL

FIG.2(A)
STRAIGHT LINE

FIG.2(B)
BRANCH OFF INTO TWO LINES AT A POINT FAR FROM A DRIVER
AND LENGTHS OF THE LINES ARE NOT THE SAME

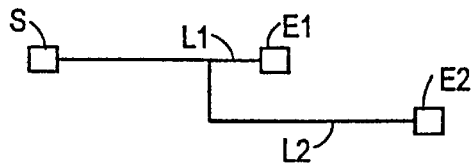

FIG.2(C)
BRANCH OFF INTO TWO LINES AT A POINT NEAR A DRIVER
AND LENGTHS OF THE LINES ARE THE SAME

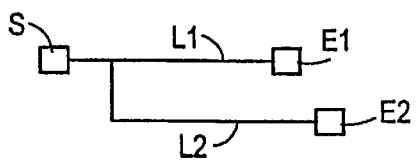

DEGREE OF WAVEFORM ROUNDING & Rw WITH RESPECT TO
THREE TYPES OF WIRING TOPOLOGIES

WAVEFORM ROUNDING →(a)STRAIGHT LINE > (b)TWO BRANCHES > (c)TWO BRANCHES

RW →(a)STRAIGHT LINE > (b)TWO BRANCHES > (c)TWO BRANCHES

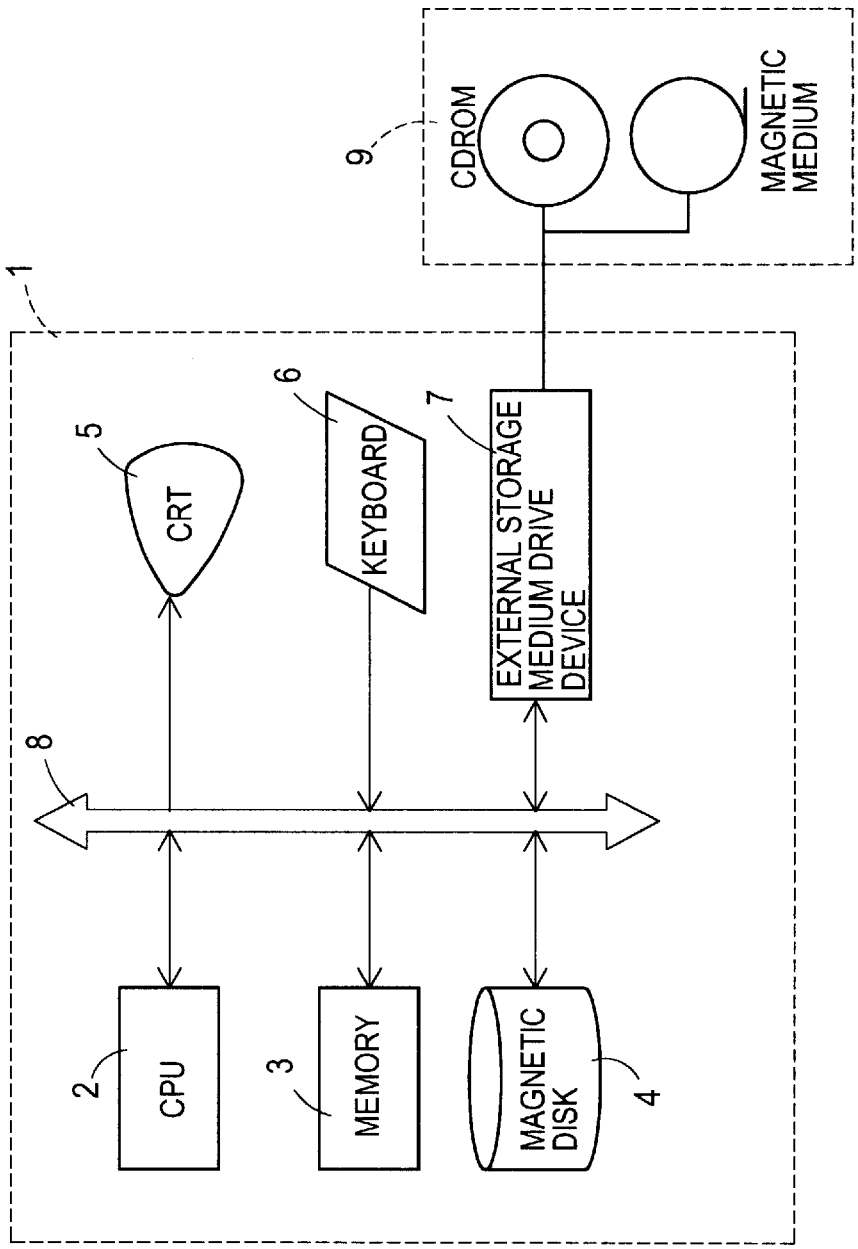

CIRCUIT CELL LAYOUT CONTROL FLOW OF THE PRESENT INVENTION

CONCEPTUAL DIAGRAM ILLUSTRATING WIRING PARAMETERS
FIG.5(A)
ALLOWABLE LONGEST WIRING (RESISTANCE = RtL)
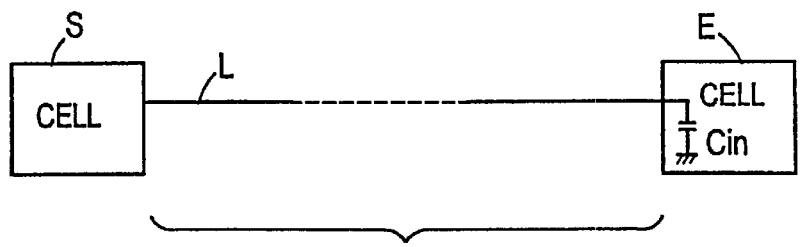
WIRING DELAY SEGMENT MODEL
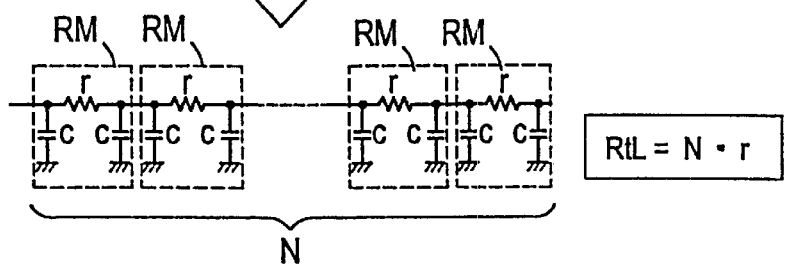
$RtL = N \cdot r$
FIG.5(B)
EFFECTIVE RESISTANCE RwL OF ALLOWABLE LONGEST WIRING
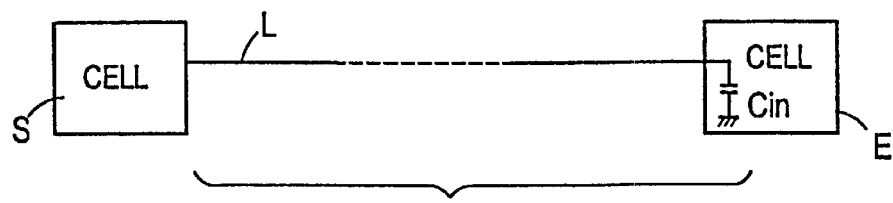
SINGLE MODEL
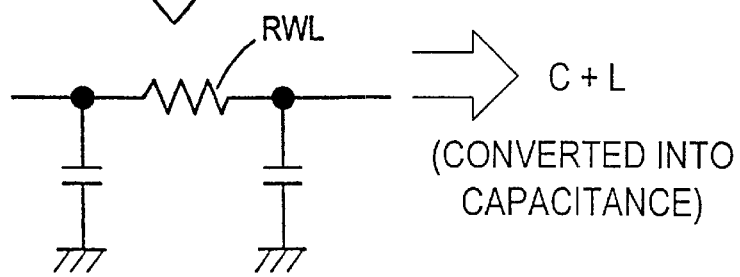
C + L
(CONVERTED INTO CAPACITANCE)

CONCEPTUAL DIAGRAM DEPICTING A WIRING LOAD BETWEEN CIRCUIT CELLS

CORRELATION DIAGRAM SHOWING THE DEPENDENCY OF AN ALLOWABLE LONGEST WIRING RESISTANCE RtL ON EACH INPUT WAVERORM ROUNDING AND THE DEPENDENCY THEREOF ON A NEXT-STAGE INPUT CAPACITANCE

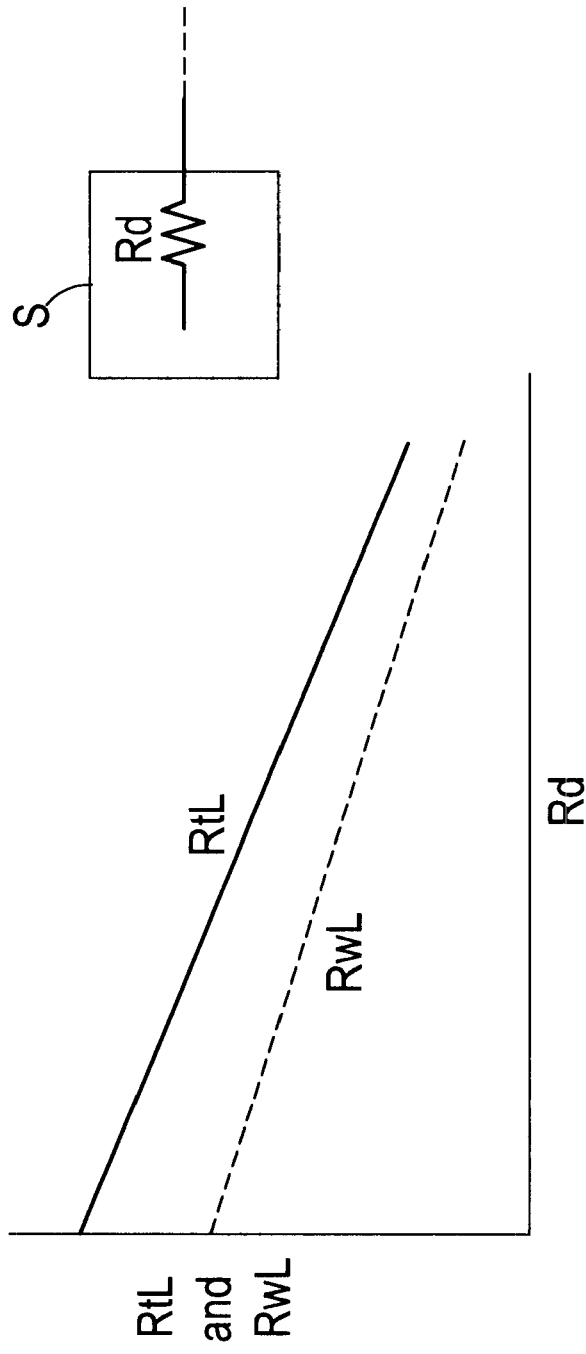
FIG.8 CORRELATION DIAGRAM SHOWING DEPENDENCY OF RtL AND RwL ON Rd

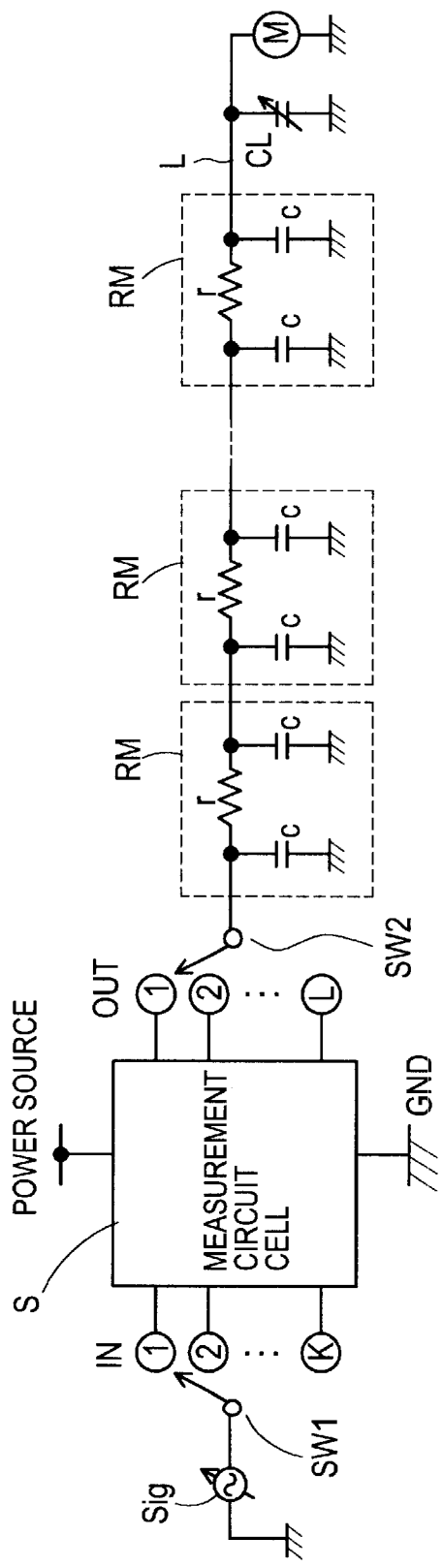
FIG.9 DIAGRAM SHOWING A MEASURING CIRCUIT FOR EXTRACTION OF WIRING PARAMETERS

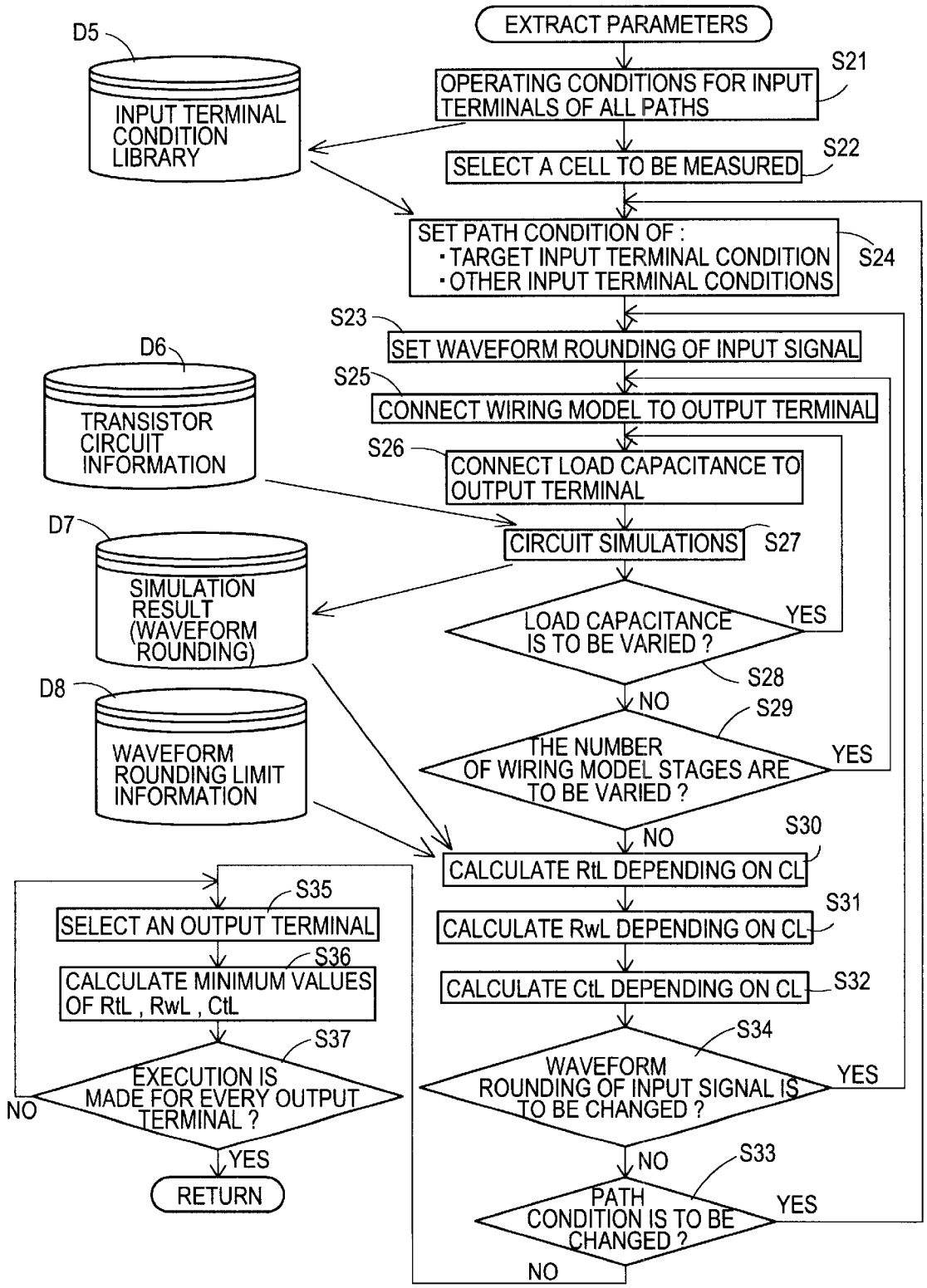
FIG. 10  FIRST EXAMPLE OF A WIRING PARAMETER EXTRACTING FLOW

FIG.11 SECOND EXAMPLE OF A WIRING PARAMENTER EXTRACTING FLOW
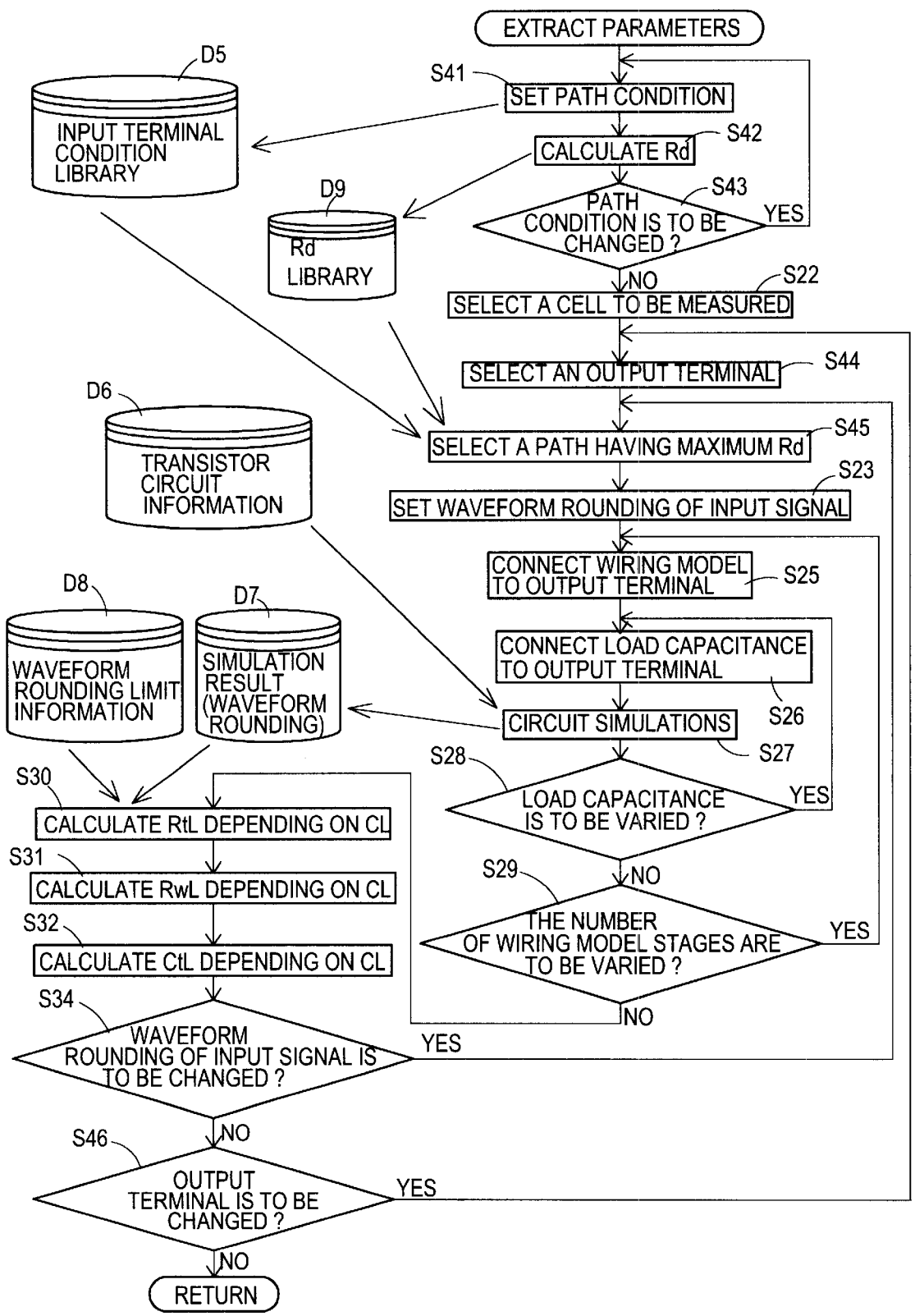

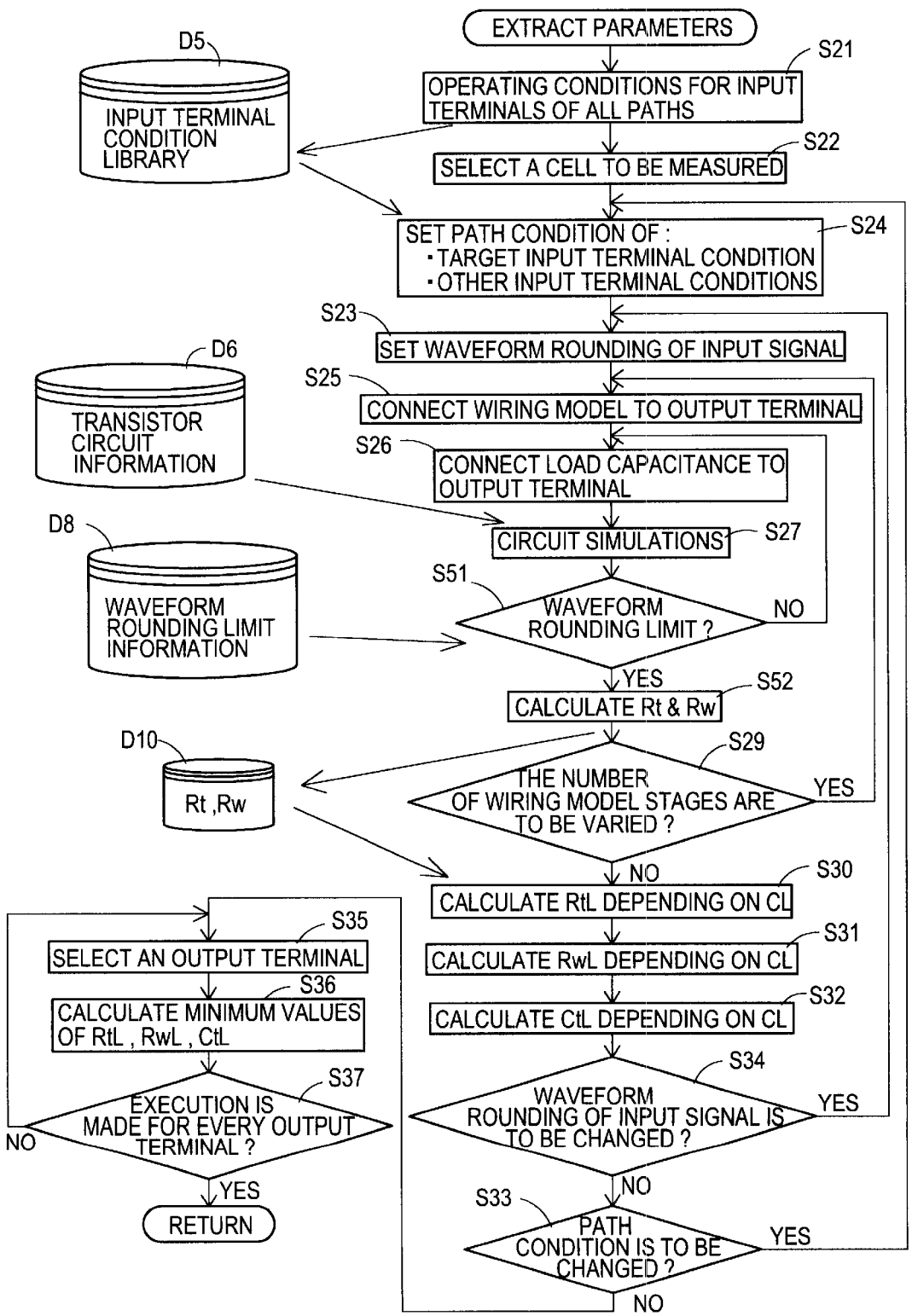
FIG.12 THIRD EXAMPLE OF A WIRING PARAMETER EXTRACTING FLOW

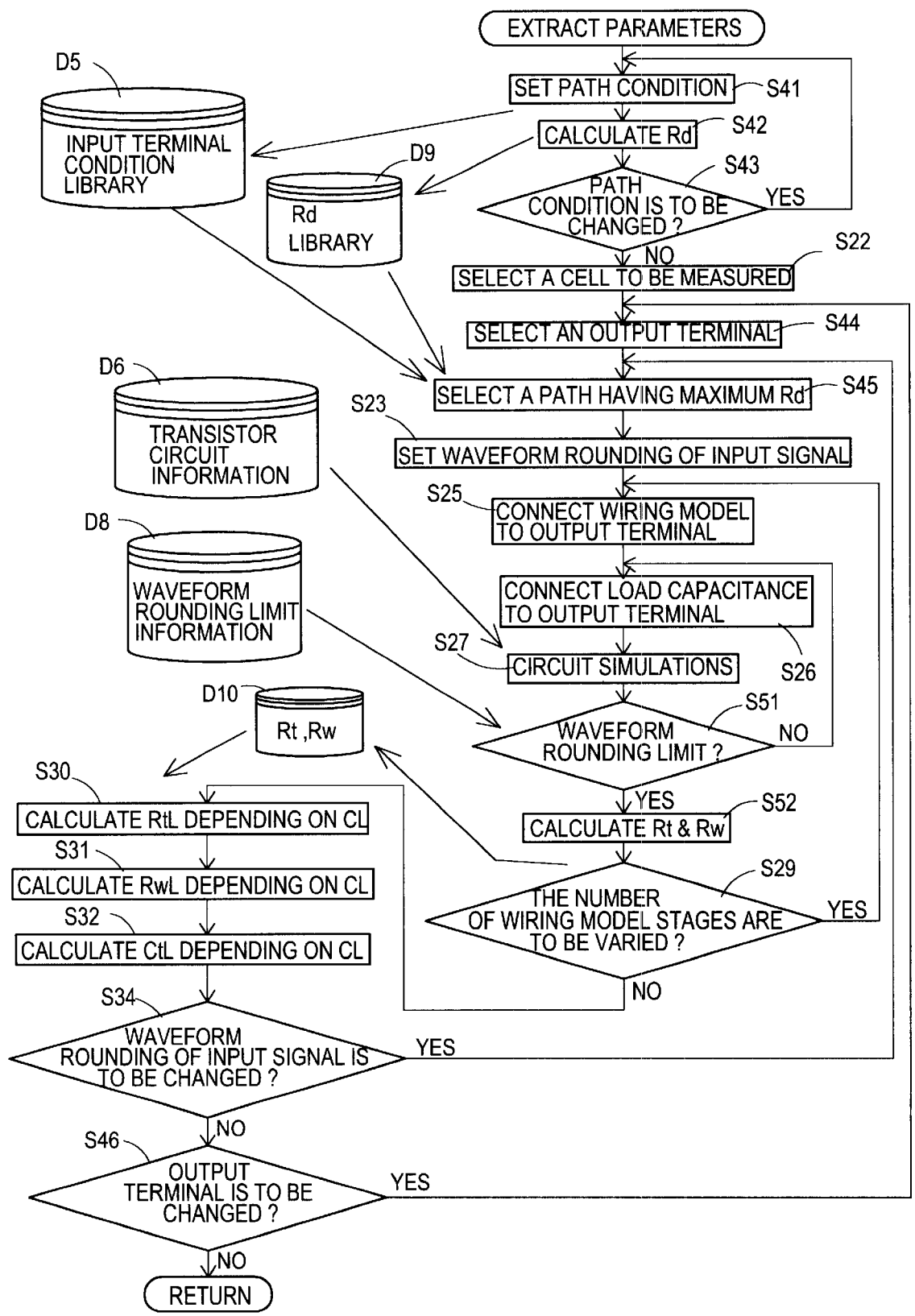
FIG. 13 FOURTH EXAMPLE OF A WIRING PARAMETER EXTRACTING FLOW

FIG.14(A) EXAMPLE FOR WIRING PARAMETER EXTRACTION
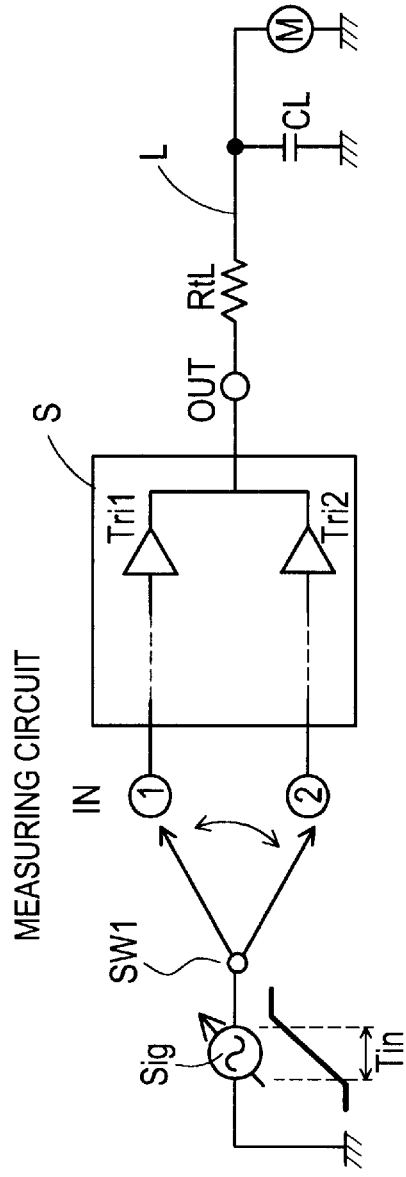
FIG.14(B) GRAPH
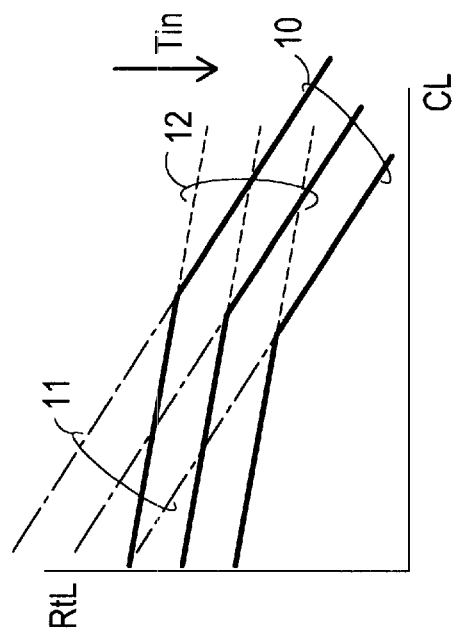

METHOD OF DESIGNING SEMICONDUCTOR INTEGRATED CIRCUIT DEVICE, AND APPARATUS FOR DESIGNING THE SAME

BACKGROUND OF THE INVENTION

1. Field of the Invention

The present invention relates to a method of and an apparatus for designing a semiconductor integrated circuit device, and particularly to a method of and an apparatus for designing a semiconductor integrated circuit device, which are capable of ensuring operations without delay calculations at an early stage of the development of the semiconductor integrated circuit device.

2. Description of the Related Art

It is necessary that the waveform rounding of a signal inputted to each of circuit cells constituting a semiconductor integrated circuit device is limited to within a predetermined time to assure gate delay times and operating timings for the semiconductor integrated circuit device. Since the waveform rounding is determined according to an input load capacitance of a next-stage circuit cell drivable by an output circuit of each circuit cell, and a wiring load, restrictions on the waveform rounding have heretofore been carried out by methods shown below.

According to a designing method offered in a TLF version 4.1 of Cadence Co., Ltd., for example, the maximum load capacitance drivable by an output circuit of each circuit cell is defined as the maximum drive load capacitance in the form of a LOAD_LIMIT function. When a sum obtained by adding input load capacitances of all next-stage circuit cells connected to the output circuits and capacitive components of all wirings connected to the next-stage circuit cells as one load capacitance exceeds the maximum drive load capacitance, warning is outputted, whereby the gate delay times and the waveform roundings are restricted to ensure the operating timings.

In Japanese Laid-Open Patent Publication No. 2000-20574, a waveform calculator 9 performs circuit simulations, based on an extracted parasitic resistance/parasitic capacitance to provide a connection rule check system dependant on the frequency at which the stability of the operation of a circuit can be confirmed with high accuracy, and a connection rule check method therefor to thereby calculate waveform roundings at output and input terminals of each cell and waveform amplitude values at the input terminals. A waveform comparator 10 compares the calculated waveform rounding values and waveform amplitude values with specified limit values of waveform rounding values and waveform amplitude values stored in a waveform library. According to the result of comparison by the waveform comparator 10, a circuit configuration change unit 11 changes a circuit configuration and a layout wiring change unit 12 changes layout/wiring.

FIG. 1 shows a circuit cell layout control flow used when wiring delays are determined by calculation in a prior art. Prior to the determination of a circuit cell layout, the extraction of parameters in circuit cells is executed (S105). A cell library (D103) corresponding to input capacitances, waveform rounding specifications of input signals, output drive capacities, etc. is ensured. Next, the circuit cell layout is temporarily determined (S104) based on circuit net information (D1) obtained at the stage of the completion of a circuit design for a semiconductor integrated circuit device to thereby obtain wiring information (D102) such as a resistance value of each wiring path, wiring load capacitances, etc.

A net to determine a circuit cell layout is selected (S1), and a delay from an intended or target circuit cell to a next-stage circuit cell is calculated (S101) based on the net information (D1), wiring information (D102) and cell library (D103). It is determined from the result of calculation whether each wiring path (S106) satisfies a delay specification of a signal inputted to the next-stage circuit cell (S102). If such a condition is not met (S102: NO), then the position of the layout of the circuit cell is changed (S104) where a change in circuit cell layout is allowed (S9: YES). When it is determined that it is necessary to change the circuit cell to one larger in drive capacity (S9: NO), the circuit cell is changed (S103) and the wiring information (D102) is changed. Thereafter, similar processing is repeated (S13: YES, S101). If the delay specification of the input signal is met (S102: YES), then the routine procedure returns to S106 where similar processing is effected on other wiring paths (S107: NO). After the processing has been effected on all the wiring paths, the above processing is repeated with respect to all nets (S7: NO). The circuit cell layout is terminated after the completion of the processing on all nets (S7: YES). Step (S101) for performing the delay calculation and Step (S102) for determining whether the result of calculation satisfies the delay specification of the input signal to the next-stage circuit cell, are effected on all the wiring paths (S16, S107), whereby a part (C100) for determining the possibility of driving of a wiring between the circuit cells is configured.

In the designing method offered in the TLF version 4.1 of Cadence Co., Ltd., however, the load capacitance is compared with the maximum drive load capacitance defined using the LOAD_LIMIT function inclusive of a capacitance value obtained by collectively adding load capacitances present on the wiring on a distributed constant basis to thereby determine a delay limit point. Since, however, the value calculated as the load capacitance value of the wiring becomes the sum of capacitance values widely distributed over the wiring on a distributed constant basis, differences in wiring topology, branch position, etc. cannot be reflected on each capacitance value. Waveform roundings, which actually propagate through a wring, differ according to the differences in their topologies as shown in FIG. 2. It is understood that even when total wiring lengths shown in FIG. 2 are equal to one another and the respective sums of wiring load capacitances are equal to one another, waveform roundings of next-stage inputs are much different from one another. Thus, the designing method offered in the TLF version 4.1 has a problem in that it cannot recognize the difference between the waveform roundings due to the differences in wiring topology and wiring branch position where the total wiring lengths are equal and the sums of the wiring load capacitances are equal. A problem also arises in that such layout wiring as to hold each waveform rounding within a predetermined limit value cannot be carried out.

In the connection rule check system and connection rule check method therefor according to Japanese Laid-Open Patent Publication No. 2000-20574, the circuit simulations are carried out based on the extracted parasitic resistance/parasitic capacitance and the delay calculations of the waveform roundings and the like are executed. Thereafter, the calculated waveform roundings and the like are compared with the specified limit values such as the waveform rounding values stored in the waveform library. Thus, a problem arises in that while the accurate waveform roundings can be calculated, it is necessary to perform delay calculations based on circuit simulations every wiring path, and enormous time is required for comparisons between the waveform rounding values and the specified limit values.

Further, the two prior arts have a problem in that the waveform roundings cannot reliably be held within the predetermined limit value. Therefore, there is the possibility of re-action of design work such as changes in layout wiring and layout cell, thus causing a problem leading to a bottleneck in the shortening of a period for the development of a semiconductor integrated circuit device.

SUMMARY OF THE INVENTION

The present invention has been made to solve the problems developed in the prior arts. Therefore, the present invention aims to provide a method of and an apparatus for designing a semiconductor integrated circuit device, which are capable of causing each waveform rounding to fall within a predetermined limit value and thereby assuring circuit operations for the semiconductor integrated circuit device without making delay calculations at an early stage of the development of the semiconductor integrated circuit device.

In order to achieve the above object, there is provided a method of designing a semiconductor integrated circuit device, according to one aspect of the present invention, wherein a circuit cell group is laid out and wired according to net information, which comprises a longest wiring load calculating step for calculating a wiring load of a drivable allowable longest wiring having taken into consideration each waveform rounding, as a first load for each load capacitance driven by each circuit cell, a wiring load estimating step for calculating an input load capacitance of each next-stage circuit cell and a second load estimated as a wiring load from the circuit cell to the next-stage circuit cell, and a determining step for comparing the first load related to the load capacitance corresponding to the input load capacitance, and the second load in size, and determining that a signal waveform inputted to the next-stage circuit cell is less than or equal to a predetermined waveform rounding limit value and drivable when the second load is smaller than the first load. There is also provided an apparatus for designing a semiconductor integrated circuit device, according to another aspect of the present invention, wherein a circuit cell group is laid out and wired according to net information, which comprises longest wiring load calculating unit for calculating a first load of a drivable allowable longest wiring having taken into consideration each waveform rounding, for each load capacitance driven by each circuit cell, wiring load estimating unit for calculating an input load capacitance of each next-stage circuit cell and a second load corresponding to a wiring load from the circuit cell to the next-stage circuit cell, and determining unit for comparing the first load related to the load capacitance corresponding to the input load capacitance, and the second load, and determining that a signal waveform inputted to the next-stage circuit cell is less than or equal to a predetermined waveform rounding limit value and drivable when the second load is smaller than the first load.

In the method and apparatus for designing the semiconductor integrated circuit device, the first load is calculated as the wiring load of the drivable allowable longest wiring having taken into consideration the waveform rounding, for each load capacitance. Further, the input load capacitance of the next-stage circuit cell and the wiring load from the circuit cell to the next-stage circuit cell are calculated as the second load. When the first and second loads are compared and the second load is smaller than the first load, the signal waveform inputted to each next-stage is judged to be less than or equal to the predetermined waveform rounding limit value and drivable.

Thus, a decision as to whether the rounding of the waveform of the signal inputted to each of the next-stage circuit cells falls within a predetermined limit value at the next-stage circuit cell, can be made without executing the calculation of delays in the propagation of the signal waveforms on the wirings. Thus, the specifications related to signal propagation delays and operating timings can be ensured with satisfactory accuracy and reliably at the early stage of the development of the semiconductor integrated circuit device, e.g., the development of a rough layout of the circuit cells without executing delay calculations based on actual wiring loads. It is possible to design a semiconductor integrated circuit device in which mutual timings are set to the optimum without shortages of margins of signal propagation delays and operating timings.

A layout wiring design having taken into consideration the waveform rounding limit of each signal waveform, can be executed without executing delay calculating processing based on the actual wiring loads. Further, it can also be executed even at the rough layout stage of the circuit cells. Accordingly, a working load on a layout wiring determining process can greatly be reduced. This greatly contributes to the shortening of a period for the development of a semiconductor integrated circuit device.

Further, characteristic variations due to hot carriers easy to develop as the waveform rounding of each signal waveform becomes large, and the influence of peripheral noise such as crosstalk noise can reliably be prevented at the early stage of the development of the semiconductor integrated circuit device. Thus, the handling of an increase in the reliability of the semiconductor integrated circuit device and an improvement in operating performance thereof can be taken early and reliably, and hence the quality of the semiconductor integrated circuit device can greatly be improved.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 2 is a conceptual diagram illustrating the correlation between waveform roundings and wiring topologies when total wiring lengths are equal;

FIG. 3 is a system diagram depicting an apparatus for designing a semiconductor integrated circuit device according to the present embodiment;

FIG. 5 is a conceptual diagram illustrating wiring parameters;

FIG. 8 is a correlation diagram illustrating the dependency of an allowable longest wiring resistance RtL and an effective resistance RwL of an allowable longest wiring on a drive resistance value Rd;

FIG. 9 is a diagram showing a measuring circuit for the extraction of wiring parameters;

FIG. 10 is a flowchart illustrating a first specific example of a wiring parameter extracting flow;

FIG. 11 is a flowchart showing a second specific example of a wiring parameter extracting flow;

FIG. 12 is a flowchart depicting a third specific example of a wiring parameter extracting flow;

FIG. 13 is a flowchart showing a fourth specific example of a wiring parameter extracting flow; and FIG. 14 is a conceptual diagram showing a specific example for wiring parameter extraction.

DETAILED DESCRIPTION OF THE PREFERRED EMBODIMENTS

Figure 4:
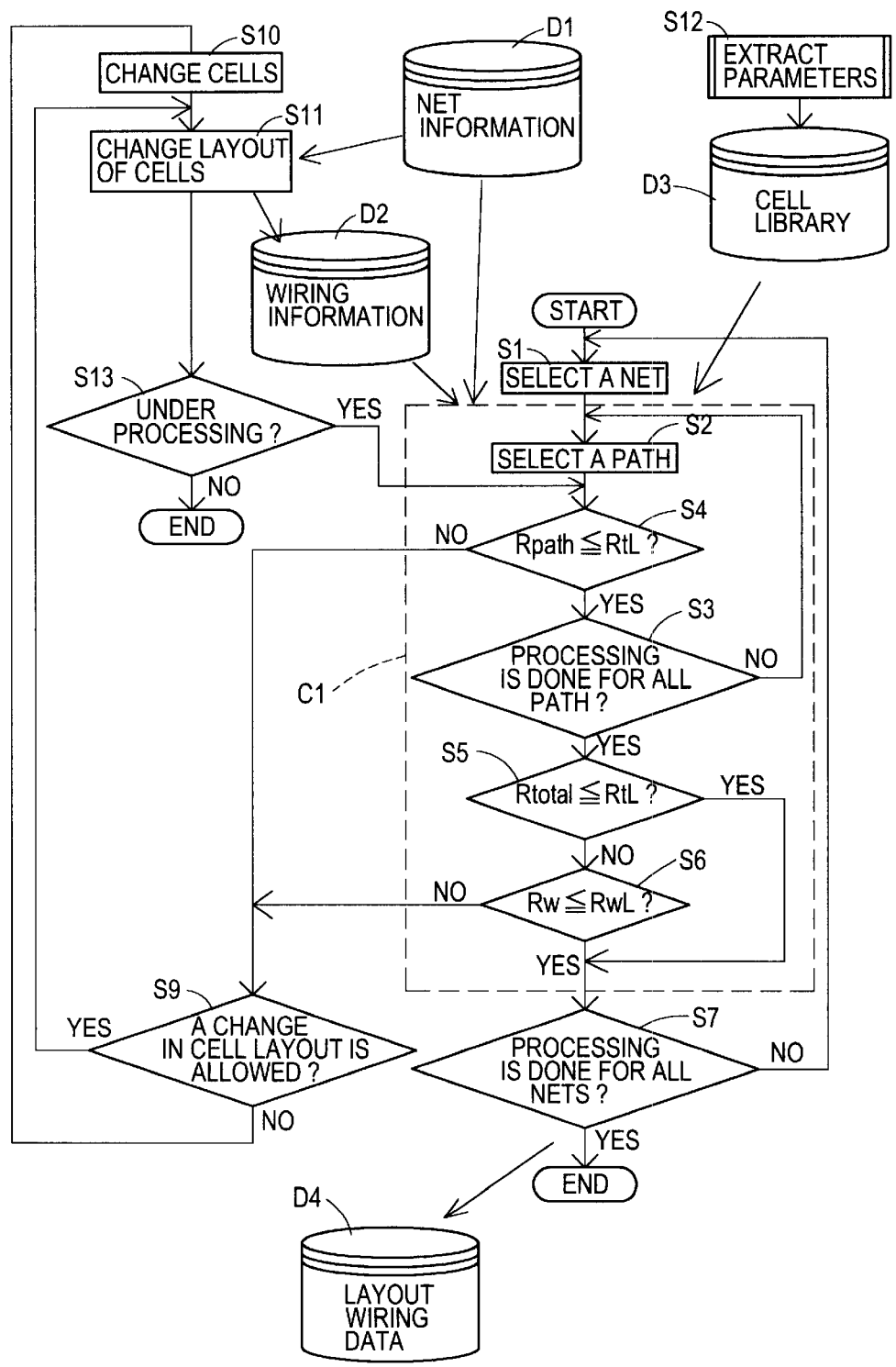
FIG. 4 is a flowchart showing a circuit cell layout control flow employed in the present embodiment.
Figure 6:
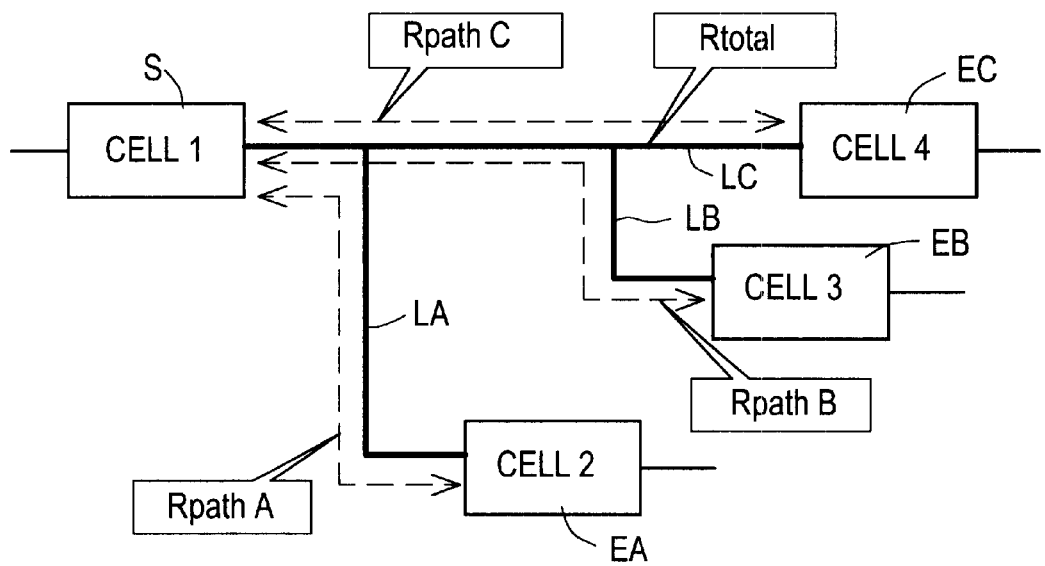
FIG. 6 is a conceptual diagram depicting a wiring load between circuit cells.
Figure 7:
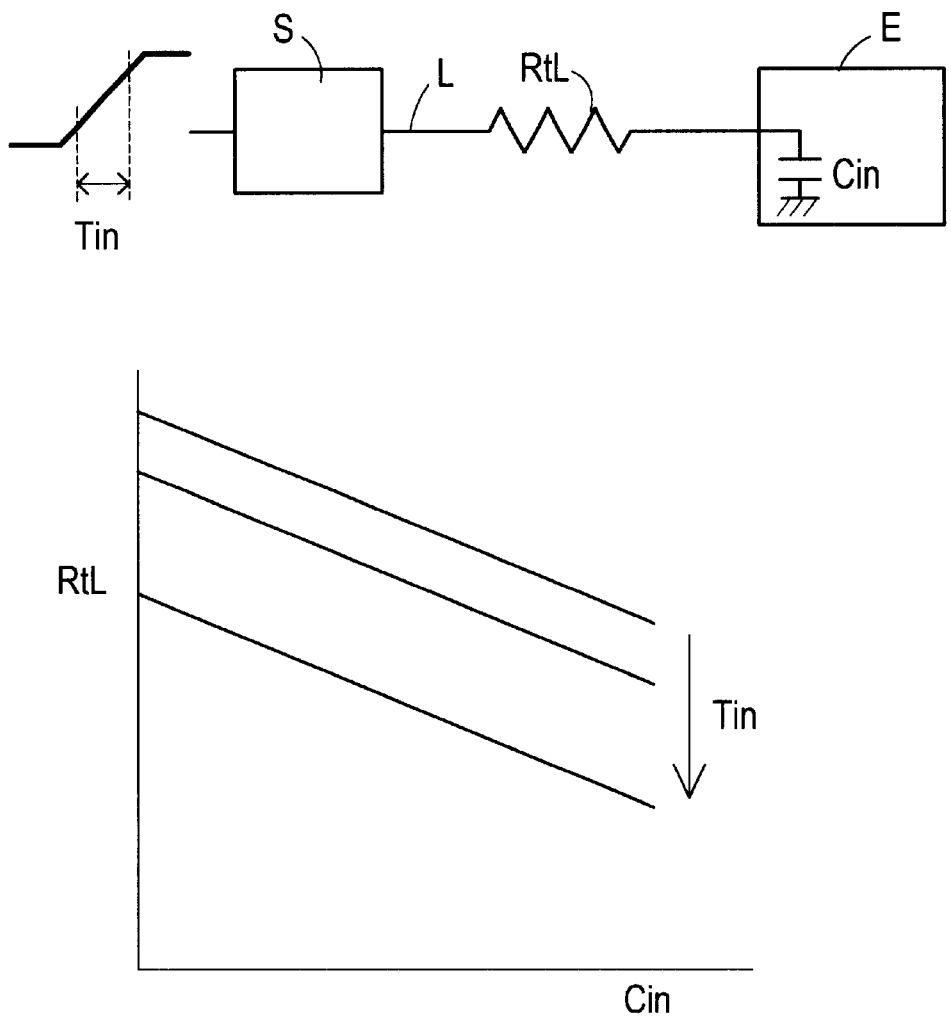
FIG. 7 is a correlation diagram showing the dependency of an allowable longest wiring resistance RtL on each input waveform rounding and the dependency thereof on a next-stage input capacitance.

Preferred embodiments, which embody a method of designing a semiconductor integrated circuit device according to the present invention and an apparatus for designing it, will hereinafter be described in detail with reference to the accompanying drawings. FIG. 2 is a conceptual diagram illustrating the correlation between waveform roundings and wiring topologies when total wiring lengths are equal. FIG. 3 is a system diagram depicting an apparatus for designing a semiconductor integrated circuit device according to the present embodiment. FIG. 4 is a flowchart showing a circuit cell layout control flow employed in the present embodiment. FIG. 5 is a conceptual diagram illustrating wiring parameters. FIG. 6 is a conceptual diagram depicting a wiring load between circuit cells. FIG. 7 is a correlation diagram showing the dependency of an allowable longest wiring resistance RtL on each input waveform rounding and the dependency thereof on a next-stage input capacitance. FIG. 8 is a correlation diagram illustrating the dependency of an allowable longest wiring resistance RtL and an effective resistance RwL of an allowable longest wiring on a drive resistance value Rd. FIG. 9 is a diagram showing a measuring circuit for the extraction of wiring parameters. FIG. 10 is a flowchart showing a first specific example of a wiring parameter extracting flow. FIG. 11 is a flowchart illustrating a second specific example of a wiring parameter extracting flow. FIG. 12 is a flowchart depicting a third specific example of a wiring parameter extracting flow. FIG. 13 is a flowchart showing a fourth specific example of a wiring parameter extracting flow. FIG. 14 is a conceptual diagram showing a specific example for wiring parameter extraction.

S represents a drive cell and E, E1, and E2 represent receiver cells. L indicates length of a wiring that connects between a driver cell and a receiver cell. All of the Figures, namely FIG. 2(A), FIG. 2(B), and FIG. 2(C) show cases such that total wiring lengths are equal. FIG. 2(A) shows a case of one S (driver cell) and one E (receiver cell) where a wiring is one straight line and wiring length is L. FIG. 2(B) shows a case of one driver cell S and two receiver cells E1 and E2, i.e. there is one branch point and the E1 and E1 are provided at the end of two branches. More specifically, it is a case that length between S and the branch point is long. And, L2 (length between the branch point and E2) is longer than L1 (length between the branch point and E1). FIG. 2(C) also shows a case of one driver cell S and two receiver cells E1 and E2. Similarly, there is one branch point and the two receiver cells E1 and E2 are provided at the end of the branch. However, vice versa, length between S and the branch point is short. And, length difference between L1 (length between the branch point and E1) and L2 (length between the branch point and E2) is not so much. In those three cases, waveform rounding at the receiver cell become smaller in the order of (A)>(B)>(C). Effective resistance Rw of wiring loads obtained from r-type wiring load model also can obtain the same correlation of (A)>(B)>(C). That is, the effective resistance Rw can prove characteristic of wiring length influenced by actual waveform rounding.

In the apparatus 1 for designing the semiconductor integrated circuit device, which is shown in FIG. 3, a memory 3, a magnetic disk unit 4, a display unit (hereinafter abbreviated as a "CRT") 5, a keyboard 6, and an external storage medium drive device 7 are connected to one another with a central processing unit (hereinafter abbreviated as a "CPU") 2 as the center. Further, external storage mediums 9 such as a CD-ROM, a magnetic medium, etc. are detachably installed on the external storage medium drive device 7.

Programs for executing the circuit cell layout control flow employed in the present embodiment, which is shown in FIG. 4 to be described later, and the wiring parameter extracting flows shown in FIGS. 10 through 13 are recorded in the memory 3 and magnetic disk unit 4 lying in the design apparatus 1. On the other hand, when they have been recorded in the external storage mediums 9 such as the CD-ROM, the magnetic medium, etc., they are recorded in the memory 3 and magnetic disk device 4 through the external storage medium drive device 7 or directly transferred to the CPU 2.

Various data files (corresponding to D1 through D3 shown in FIG. 4 and D5 through D10 shown in FIGS. 10 through 13) shown in FIG. 4 and FIGS. 10 through 13 have also been recorded in the magnetic disk unit 4 and the external storage mediums 9 such as the CD-ROM, the magnetic medium, etc. Reference to them is made as needed, based on a command issued from the CPU 2 in accordance with the processing of the programs.

Wiring parameters extracted while reference is being made to the various data files (D5 through D10) according to the programs for executing the wiring parameter extracting flows shown in FIGS. 10 through 13, are stored in a cell library (D3). A circuit cell layout is carried out while referring to the various data files (D1 through D3) in accordance with the program for executing the circuit cell layout control flow employed in the present embodiment shown in FIG. 4, and the result of layout wiring is stored in layout wiring data (D4) and the present processing is completed.

Incidentally, if the above programs and data files are stored in the external storage mediums 9 such as the CD-ROM, the magnetic medium, etc. through the external storage medium drive device 7, then the transfer thereof to another design apparatus can easily be carried out.

The definition, findings related to wiring loads between circuit cells, the drive capacity of each circuit cell, and the input capacitance of a next-stage circuit cell driven by the circuit cell, which are necessary upon execution of flow processing, will now be summarized prior to the description of a specific control flow.

FIG. 5 shows the definition of various wiring parameters. FIG. 5(A) illustrates a resistance RtL of an allowable longest wiring. The allowable longest wring resistance RtL indicates a resistance value of an allowable longest wiring for a wiring path L at which when a circuit cell S drives an input load capacitance Cin of a next-stage circuit cell E through the wiring path L, it is capable of driving the input load capacitance Cin of the next-stage circuit cell within a predetermined waveform rounding limit value. Further, the allowable longest wiring resistance RtL corresponds to the sum of each individual segment model resistance values r at the time that π-type wiring delay segment models RM each defined by a wiring resistance and a load capacitance on the wiring path L are connected in a multi-stage (N stages) so that each waveform rounding reaches a predetermined limit value at an input terminal of the next-stage circuit cell E. The allowable longest wiring resistance RtL is determined as RtL=N·r. The wiring path L in this case has no branching and hence the allowable longest wiring resistance coincides with the resistance value of the wiring path L.

The allowable longest wiring resistance RtL is a constituent element or component of a first load. It can correspond to different resistances as described herein. The load capacitance on the wiring path L is a component of the first load and corresponds to a first capacitance.

FIG. 5(B) shows an effective resistance RwL of an allowable longest wiring. The allowable longest wiring effective resistance RwL is a resistive component obtained by adding a load capacitance of a wiring path L and an input load capacitance Cin of a next-stage circuit cell E to the wiring path L having the allowable longest wiring resistance RtL determined in FIG. 5(A), calculating the sum of admittances as viewed from an output terminal of a circuit cell S, and converting the wiring path L to a π-type wiring load model equivalent in delay time to the above. The wiring path L in this case has no branching to the same total wiring length, and hence the allowable longest wiring effective resistance RwL indicates the maximum value of effective resistances. Further, the allowable longest wiring effective resistance RwL is converted into capacitance from or based on the delay time determined by the derived π-type wiring load model, whereby CtL can also be calculated.

The allowable longest wiring effective resistance RwL corresponds to a first wiring load parameter and a fourth resistance. The capacitance-converted value of the allowable longest wiring effective resistance RwL corresponds to the first wiring load parameter.

An effective resistance Rw of a wiring load is a resistive component obtained by calculating the sum of admittances as viewed from an output terminal of a circuit cell, based on the wiring resistance and load capacitance on a wiring path L and the input load capacitance of a next-stage circuit cell, and converting a delay in the propagation of a signal waveform from the circuit cell to the next-stage circuit cell into a π-type wiring load model so as to become equivalent in delay time. When a plurality of next-stage cells are connected to the wiring path, a resistive component can be calculated by compressing a wiring tree having branches to a π-type wiring load model by a 2nd Order Drive Point Admittance method proposed by P. R. O'Brien et al. or a Pade approximation-based Moment Matching method, or the like. Incidentally, these compressing methods have been described in P.R. O'Brien and L. Savarino, "Modeling the driving point characteristics of resistive interconnect for accurate delay estimation", Proc. of the Int. Conf. on Computer-Aided Design, November 1989, or N. Gopal and L. T. Pillage, "Evaluation of on-chip interconnect using moment matching", Proc. of the Int. Conf. on Computer-Aided Design, November 1991.

The effective resistance Rw of the wiring load corresponds to a second wiring load parameter and a fifth resistance. Further, the above methods of executing compression to the π-type wiring load model are illustrative examples of a second wiring load model, and a wiring load model obtained by converting a wiring path having branches to a π-type wiring load model according to a predetermined approximation method.

Now, the roundings of the signal waveforms with respect to the three types of wiring topologies shown in FIG. 2 decrease in order of (a)>(b)>(c) as described above. This can also be confirmed similarly even from the effective resistances Rw of the wiring loads, which are obtained from the above-described compressed π-type wiring load models. Namely, the effective resistances Rw of the wiring loads are also reduced in order of (a)>(b)>(c), and hence support characteristics with respect to actual waveform roundings.

FIG. 6 is a conceptual diagram typically showing the manner of wiring between circuit cells. A circuit cell 1(S) serves so as to drive circuit cells 2 through 4 (EA, EB and EC). An output terminal of the circuit cell 1(S) is connected to an input terminal of the circuit cell 2(EA) by a wiring path LA having a resistance value RpathA. The output terminal of the circuit cell 1(S) is connected to an input terminal of the circuit cell 3(EB) by a wiring path LB having a resistance value RpathB. Further, the output terminal of the circuit cell 1(S) is connected to an input terminal of the circuit cell 4(EC) by a wiring path LC having a resistance value RpathC. The sum of resistances of wiring loads is represented as Rtotal. The input terminals of the respective circuit cells (EA, EB and EC) have unillustrated input load capacitances respectively. Further, the drive capacity of the circuit cell 1(S) can be represented as a drive resistance value Rd. The drive capacity and the driveres istance value Rd result in the relationship that the greater the drive capacity, the smaller the drive resistance value Rd.

FIGS. 7 and 8 respectively show the correlation between the wiring parameters defined as described above. In FIG. 7, the horizontal axis is defined as an input load capacitance Cin of a next-stage circuit cell E, and the vertical axis is defined as an allowable longest wiring resistance RtL drivable by a circuit cell S. FIG. 7 is a graph obtained by plotting roundings (Tin) of the waveform of a signal inputted to the circuit cell S as parameters. It is understood from FIG. 7 that as the waveform roundings (Tin) of the input signal increase, the resultant graphs are shifted downward, so that the allowable longest wiring resistance RtL drivable by the circuit cell S is reduced, whereby it is necessary to shorten a wiring length extending from the circuit cell S to the next-stage circuit cell E. Further, the circuit cell S has negative dependency on the next-stage circuit cell E even between the allowable longest wiring resistance RtL and the input load capacitance Cin of the next-stage circuit cell E. If the input load capacitance Cin of the next-stage circuit cell E increases, then the allowable longest wiring resistance RtL drivable by the circuit cell S is reduced. It is thus necessary to shorten the wiring length to the next-stage circuit cell E. Incidentally, each waveform rounding is plotted in FIG. 7 on condition that the drive capacity (drive resistance value Rd) of the circuit cell is fixed.

FIG. 8 is a graph obtained by plotting each allowable longest wiring resistance RtL drivable by a circuit cell S with respect to a drive resistance value Rd indicative of the drive capacity of the circuit cell S, and plotting the dependency of each allowable longest wiring effective resistance RwL calculated based on the allowable longest wiring resistance RtL, a load capacitance of a wiring path, and an input load capacitance Cin. FIG. 7 shows that as the drive capacity of the circuit cell S decreases and the drive resistance value Rd increases, the allowable longest wiring resistance RtL and the allowable longest wiring effective resistance RwL are both reduced, so that a drivable wiring length becomes short.

Incidentally, the characteristics shown in FIGS. 7 and 8 indicate different dependencies according to the circuit cells S. Thus, characteristics set every circuit cell are grasped upon an actual layout of circuit cells S. It is further necessary to calculate the allowable longest wiring resistance RtL, allowable longest wiring effective resistance RwL and capacitance-converted value CtL of RwL, which are most suitable according to each waveform rounding (Tin) of the input signal, the drive capacity (drive resistance Rd), the input load capacitance Cin.

Figure 1:
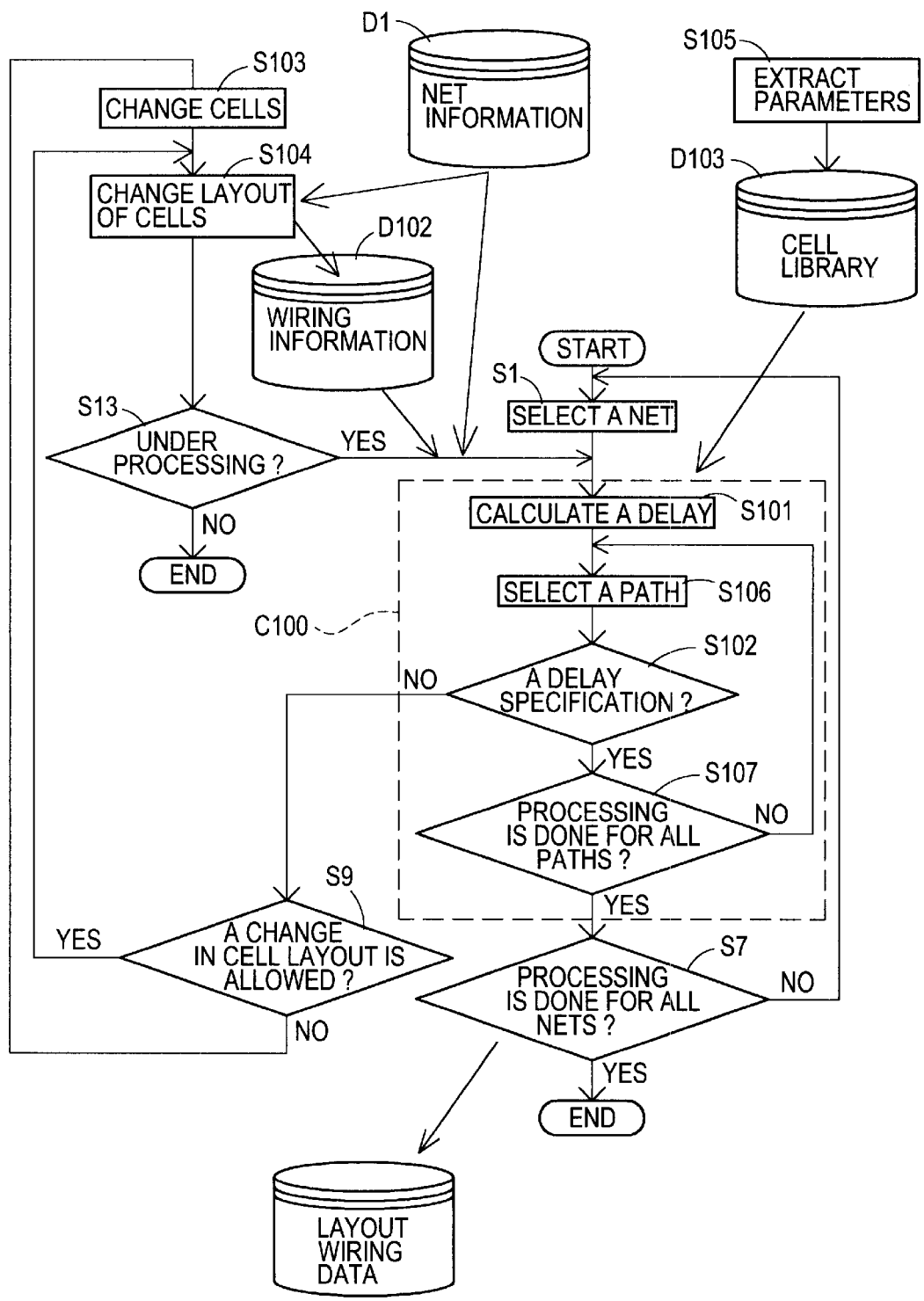
FIG. 1 is a flowchart showing a circuit cell layout control flow employed in a prior art.

Referring back to FIG. 4, the circuit cell layout control flow employed in the present embodiment will be explained. Of the respective steps and various data files shown in FIG. 4, those designated at the same numerals as those shown in the circuit cell layout control flow employed in the prior art shown in FIG. 1 respectively indicate functions similar to those in the control flow employed in the prior art, and their description will therefore be omitted herein. Described specifically, they correspond to control steps S1, S7, S9 and S13, and data files (D1 and D4).

An intended or target net is selected according to the start of the circuit cell layout control flow (S1). A decision as to whether wiring is allowed, is carried out based on the cell library (D3) stored with the circuit cell wiring parameters extracted according to net information (D1), wiring information (D2) and a wiring parameter extracting flow (S12) to be described later. A determination part (Cl) for determining the possibility of driving of wiring between circuit cells is made up of S2 through S6.

After a wiring path on the target net selected in SI has been selected (S2), the determination part compares a wiring path resistance Rpath from a target output terminal of a target circuit cell to a target next-stage circuit cell and an allowable longest wiring resistance RtL for the target circuit cell (S4). When Rpath is greater than RtL (S4: NO), it indicates that the wiring path from the target circuit cell to the target next-stage circuit cell is longer than an allowable longest wiring length. Since the next-stage circuit cell cannot be driven within a predetermined waveform rounding limit value at this time, a circuit cell layout position is changed (S11) if a change in its layout position is allowed (S9: YES). If the change in the placement of the circuit cell is not allowed (S9: NO), then the corresponding circuit cell is changed to a circuit cell large in drive capacity (S10) and the position of its placement is changed (S11). Further, the wiring information (D2) is updated and the process of S4 is continued (S13: YES, S4). On the other hand, when Rpath is less than or equal to RtL (S4: YES), it is determined that there is a possibility that the wiring path will be shorter than the allowable longest wiring length and the next-stage circuit path will be able to be driven within the predetermined waveform rounding limit value. In this case, the wiring path is changed to another path and similar processing is effected thereon. If the condition of S4 is met for all the wiring paths, then the routine procedure proceeds to a process of S5 (S3: YES).

In S5, the sum Rtotal of resistances of wiring loads and the allowable longest wiring resistance RtL are compared (S5). A comparison is made between the sum of target net wiring lengths and the allowable longest wiring length to determine whether the sum thereof is longer than the allowable longest wiring length. If Rtotal is found to be less than or equal to the allowable longest wiring resistance RtL (S5: YES), it is then determined that the next-stage circuit cell can be driven within the predetermined waveform rounding limit value. Further, the process of the determination part (C1) is completed and the routine procedure proceeds to S7. When the Rtotal is greater than the allowable longest wiring resistance RtL (S5: NO), there is a possibility that the next-stage circuit cell will not be capable of being driven within the predetermined waveform rounding limit value. Therefore, the routing procedure proceeds to S6.

In S6, a comparison is made between an effective resistance Rw of each wiring load and an allowable longest wiring effective resistance RwL (S6). Here, the effective resistance Rw of the wiring load is a resistive component for a $\pi$-type wiring load model obtained by compressing a tree-like wiring net including branches, which is connected to an output terminal of a target or objective circuit cell by the Moment Matching method or the like. Since wiring paths having branched topologies are reduced in signal waveform rounding as compared with a branch-free one under the same total wiring lengths, the effective resistance is estimated to be smaller than a resistance component at the branch-free one. On the other hand, the allowable longest wiring effective resistance RwL indicates a resistive component obtained by converting the allowable longest wiring resistance RtL to a $\pi$-type wiring load model. Since the allowable longest wiring resistance RtL means a drivable branch-free longest wiring path which has taken into consideration each waveform rounding of a target circuit cell, it results in the worst resistance value obtained by making an approximation of each wiring load to the $\pi$-type wiring load model. Thus, when the effective resistance Rw of the wiring load is less than or equal to the allowable longest wiring effective resistance RwL (S6: YES), it means that each wiring load estimated from the wiring net is less than or equal to a drivable wiring load having taken into consideration the waveform rounding of the target circuit cell. Therefore, the waveform rounding at the next stage is judged to fall within a predetermined limit value. Further, the process of the determination part (C1) is completed and the routine procedure proceeds to S7. When Rw is greater than or equal to RwL (S6: NO), it means that each wiring load estimated from the wiring net is larger than the drivable wiring load having taken into consideration the waveform rounding of the target circuit cell. Therefore, the target circuit cell cannot be driven in the case of the waveform rounding lying within the predetermined limit value. Thus, a change in the position of the layout or placement of the target circuit cell is made through S9 (Sl1) or the corresponding circuit cell is changed to a circuit cell larger in drive capacity (S10). Thereafter, the routine procedure is continued (S13: YES, S4).

If the above processing is effected on all the nets (S7: NO) and each waveform rounding is judged to fall within a predetermined limit value in regard to all the nets, then layout wiring data is determined (D4) and the processing is terminated (S7: YES).

In order to produce wiring information (D2) from a circuit cell layout in S10 and S11, it is not always necessary to set even detailed layout wiring between circuit cells. The wiring information can be estimated even from circuit information at logic composition, which is derived from a logical expression or the like, approximate values of the lengths of connected wirings, which are obtained from a rough layout of circuit cells, etc. If information close to an actual semiconductor integrated circuit device layout such as the detailed layout wiring between the circuit cells exists, then the layout wiring between the circuit cells, which satisfies a waveform rounding limit, can be carried out with a high degree of accuracy. If the circuit information at the logic composition and the approximate values of the lengths of the connected wirings, which are obtained from the rough layout of the circuit cells, are utilized, then specifications for limiting waveform roundings caused by the semiconductor integrated circuit device layout can accurately be grasped at an early stage of the design of the semiconductor integrated circuit device. It is also possible to prevent the re-action or the like of the layout wiring beforehand and shorten a development period.

As data stored in the wiring information (D2), the sum Rtotal of the resistances of the wiring loads connected to the respective output terminals of the circuit cells, the wiring path resistance Rpath from each output terminal to the next-stage circuit cell, the effective resistance Rw for the π-type wiring load model obtained by compressing the tree-like wiring net including the branches through the use of the Moment Matching method or the like, etc. are stored. Wiring parameters extracted based on the wiring parameter extracting flow to be described later, etc. are stored in the cell library (D3). Described specifically, a waveform rounding limit value of a signal inputted to each circuit cell, an input load capacitance Cin of the circuit cell, a drive resistance value Rd thereof, an allowable longest wiring resistance RtL, an effective resistance RwL of an allowable longest wiring, a capacitance converted value CtL of RwL, etc. are stored therein.

In order to specifically describe a flow for the determination part (C1) shown in FIG. 4, a circuit cell layout wiring having wiring topologies shown in FIG. 6 will now be explained as an example with a circuit cell having wiring parameters of a circuit cell shown in FIG. 5 as a target cell. In FIG. 5, the target circuit cell S has a predetermined allowable longest wiring resistance RtL characteristic and an allowable longest wiring effective resistance RwL characteristic according to waveform rounding (Tin) of an input signal and an input load capacitance Cin of a next-stage circuit cell E. In FIG. 6, the target circuit cell S is defined as a cell 1, the next-stage circuit cells are respectively defined as a cell 2 (EA), a cell 3 (EB) and a cell 4 (EC), and the resistances of wiring paths LA, LB and LC lying between the cell 1 (S) and the cell 2(EA), the cell 1(S) and the cell 3 (EB), and the cell 1 (S) and the cell 4 (EC) respectively are defined as RpathA, RpathB and RpathC respectively. The sum of resistances of wiring loads at the time that all the next-stage circuit cells EA, EB and EC are connected, is defined as Rtotal.

In S2, the wiring path LA is selected with respect to the target or intended net selected in S1 of FIG. 4. In S4, the resistance RpathA of the wiring path LA for connecting a target output terminal of the target circuit cell S and the next-stage circuit cell EA to be driven, and an allowable longest wiring resistance RtL for the target circuit cell S are compared. When RpathA is greater than RtL and the wiring path LA is longer than an allowable longest wiring length (S4: NO), the next-stage circuit path EA cannot be driven within a predetermined waveform rounding limit value. Therefore, the positions of placement of the circuit cells S and EA are changed (S9: YES, S11) or the circuit cell S is changed to a circuit cell larger in drive capacity (S9: NO, S10), whereby wiring information (D2) is updated and the process of S4 is continued (S13: YES, S4). On the other hand, when RpathA is less than or equal to RtL (S4: YES), it is determined that there is a possibility that the wiring path LA will be shorter than the allowable longest wiring length and the next-stage circuit path EA will be able to be driven within the predetermined waveform rounding limit value. In this case, the wiring path is successively changed to other wiring paths LB and LC and similar processing is effected thereon. If the condition of S4 is met for all the wiring paths LA, LB and LC, then the routine procedure proceeds to the process of S5 (S3: YES).

In S5, the sum Rtotal of resistances of wiring loads in an intended or target net and the allowable longest wiring resistance RtL are compared (S5). A comparison is made between the sum of wiring lengths of the target net and the allowable longest wiring length to determine whether the sum thereof is longer than the allowable longest wiring length. If Rtotal is found to be less than or equal to the allowable longest wiring resistance RtL (S5: YES), it is determined that the next-stage circuit cells EA, EB and EC can be driven within the predetermined waveform rounding limit value. Further, the processing is completed and the routine procedure proceeds to S7. When the Rtotal is greater than the allowable longest wiring resistance RtL (S5: NO), there is a possibility that the next-stage circuit cells will not be able to be driven within the predetermined waveform rounding limit value. Therefore, the routing procedure proceeds to S6.

In S6, a comparison is made between an effective resistance Rw of each wiring load and an allowable longest wiring effective resistance RwL (S6). Here, the allowable longest wiring effective resistance RwL is a worst value of a resistive component for a atype wiring load model calculated by the Moment Matching method or the like. Thus, when Rw is less than or equal to RwL (S6: YES), it means that each wiring load estimated from the wiring net is less than or equal to a drivable wiring load having taken into consideration the waveform rounding of the target circuit cell S. Therefore, the waveform roundings at the next-stage circuit cells EA, EB and EC are respectively judged to fall within a predetermined limit value. Further, the processing of the determination part (C1) is terminated and the routine procedure proceeds to S7. When Rw is greater than RwL (S6: NO), it means that each wiring load estimated from the wiring net is larger than the drivable wiring load having taken into consideration the waveform rounding of the target circuit cell S. Therefore, the target circuit cell S cannot be driven in the case of the waveform rounding lying within the predetermined limit value. Thus, a change in the position of any of the circuit cells S, EA, EB and EC is made through S9 (S11) or the circuit cell S is changed to a circuit cell larger in drive capacity (S10). Under this condition, the routine procedure is continued (S13: YES, S4).

If the above processing is effected on all the nets (S7: NO) and each waveform rounding is judged to fall within the predetermined limit value in regard to all the nets, then layout wiring data is determined (D4) and the processing is completed (S7: YES).

According to the above circuit cell layout control flow, a decision as to whether the roundings of the waveforms of the signals inputted to the next-stage circuit cells EA, EB and EC respectively fall within a predetermined limit value, can be made without executing the calculation of delays in the propagation of the signal waveforms on the wiring paths LA, LB and LC upon layout wiring of the circuit cells S, EA, EB and EC. Thus, the specifications related to signal propagation delays and operating timings can be ensured with satisfactory accuracy and reliably at the early stage of the development of the semiconductor integrated circuit device, e.g., the development of a rough layout of the circuit cells S, EA, EB and EC without executing delay calculations based on the actual wiring loads RpathA, RpathB and RpathC. It is possible to design a semiconductor integrated circuit device in which mutual timings are set to the optimum without shortages of margins of signal propagation delays and operating timings.

Namely, since a decision as to whether the corresponding circuit cell can be driven within a predetermined waveform rounding limit value for each load capacitance, can be determined from a wiring resistance estimated from layout wiring information, the signal waveform can easily be set within the predetermined waveform rounding limit value by roughly calculating the wiring resistance at the rough layout stage of each circuit cell, and margins of signal propagation delays and operating timings can be ensured. Further, since a decision as to whether each circuit cell can be driven within a predetermined waveform rounding limit value, can be made by converting it to a wiring load model according to a wiring load and a load capacitance estimated from net information and layout wiring information, a signal waveform can easily be set within a predetermined waveform rounding limit value and margins of signal propagation delays and operating timings can be ensured, according to a wiring load estimated at a rough layout stage of each circuit cell and an input load capacitance obvious from the net information. Furthermore, since a decision as to whether the circuit cell can be driven within the predetermined rounding limit value for each load capacitance, can be made according to the conversion to a π-type wiring load model, a signal waveform can easily be set within a predetermined waveform rounding limit value and margins of signal propagation delays and operating timings can be ensured, according to the wiring load estimated at the rough layout stage of each circuit cell and the input load capacitance obvious from the net information. Even when the signal waveform is judged to be greater than or equal to the waveform rounding limit value according to the wiring resistance, the signal waveform can be judged to be less than or equal to the predetermined waveform rounding limit value from a comparison made between wiring load models. A higher accuracy waveform rounding limitation can be placed on the signal waveform.

A layout wiring design having taken into consideration the waveform rounding limit of the signal waveform, can be executed without executing delay calculating processing based on the actual wiring loads RpathA, RpathB and RpathC. Further, since it can also be executed at the rough layout stage of the circuit cells S, EA, EB and EC, a working load on a layout wiring determining process can greatly be reduced and a period for the development of a semiconductor integrated circuit device can be shortened.

Further, characteristic variations due to hot carriers easy to develop as the waveform rounding becomes large, and the influence of peripheral noise such as crosstalk noise can reliably be prevented at the early stage of the development of the semiconductor integrated circuit device. Thus, the handling of an increase in the reliability of the semiconductor integrated circuit device and an improvement in operating performance thereof can be taken early and reliably, and the quality of the semiconductor integrated circuit device can be improved.

A description will next be made of a process for extracting wiring parameters such as an allowable longest wiring resistance RtL, an allowable longest wiring effective resistance RwL and a capacitance-converted value CtL of RwL, etc. employed in each circuit cell, with respect to the waveform rounding of an input signal and the input load capacitance of the next-stage circuit cell. The wiring parameters are extracted according to parameter extracting flows (shown in FIGS. 10 through 13) to be described later, based on a measuring circuit for extracting the wiring parameters, which is shown in FIG. 9.

In FIG. 9, a source voltage and a ground potential (hereinafter described as a "GND potential") are connected to a circuit cell S to be measured. A waveform generator Sig connected between the measurement circuit cell S and the GND potential is connected to any of input terminals IN1 through INK. The waveform generator Sig is a device capable of generating a waveform such as a square waveform whose waveform rounding can be varied. The waveform generator Sig supplies an input signal to any of the input terminals IN1 through INK, which is connected thereto. At this time, an unillustrated bias circuit or the like suitably applies a signal level having a predetermined potential to each of other input terminals to which the waveform generator Sig is not connected. This results from the following reason. Due to the difference between input signal conditions (hereinafter described as "path conditions") for the input terminals IN1 through INK, paths for the propagation of each signal in the circuit cell S and mechanisms for the production of each signal therein are respectively different from one another. Further, the circuit cell S varies in propagation delay and in drive capacity of the next-stage circuit cell. Therefore, it is necessary to extract wiring parameters as a result of comparisons and examinations of operations at all the path conditions different in operating state.

A capacitance load CL and a wiring load for a wiring path L are connected to respective output terminals OUT1 through OUTL of the measurement circuit cell S as input loads of a next-stage circuit cell. The capacitance load CL detects or examines all the circuit cells having possibilities of being connected as the next-stage circuit cells. It is varied in a range of a load capacitance containing input load capacitances of these circuit cells. Further, the wiring load comprises a wiring load segment model RM having a π-type configuration. For example, models are used in which wiring resistances and capacitances per wiring unit length are configured as π-type wiring load models. Further, wiring load segment models RM are successively added with each waveform rounding of an input signal and a load capacitance CL as parameters. Thereafter, wiring parameters at the waveform roundings of the predetermined input signal are calculated based on the load capacitance CL and the sum of the wiring load segment models RM at the time that a signal waveform detected by a detector M through the use of the load capacitance CL reaches a predetermined waveform rounding limit value.

These extracting processes are effected on all the path conditions different in operating state by suitably changing combinations of input signals applied to the input terminals IN1 through INK every output terminal OUT1 through OUTL. Thus, wiring parameters for the measuring circuit cell S are extracted.

First through fourth specific examples will be explained below as specific examples about specific wiring parameter extracting flows.

The first specific example shown in FIG. 10 is one in which waveform roundings of input signals and wiring loads are changed for respective path conditions, the roundings of the signal waveforms are calculated every load capacitance, and the minimum values of drive limitations obtained every output terminal are selected therefrom and extracted as wiring parameters.

Firstly, operating conditions for input terminals of all paths used for all the circuit cells are brought into library form as an input terminal condition library (D5) (S21). A circuit cell to be measured is selected upon extraction (S22). Further, a condition for a target input terminal to which an input signal is inputted, conditions for signal potentials applied to other input terminals and the like are set as path conditions (S24). The waveform rounding of the input signal is set (S23). Here, the waveform rounding of the input signal is determined according to circuit specifications of a semiconductor integrated circuit device used by a target circuit cell. When, for example, the circuit cell is used in circuit specifications which requires a high-speed operation such as a system clock, an abruptly-transitioned waveform rounding is required as compared with the commonly-used waveform rounding. Further, for example, a selection as to whether the waveform rounding corresponds to either the normal waveform rounding or the abrupt waveform rounding, is made according to the circuit specifications used by the circuit cell, or a selection as to whether parameters should be obtained with respect to the two, is carried out. There may be cases in which even in the case of the high-speed operation, stages are provided to extract parameters with respect to a plurality of waveform roundings.

Next, wiring models and a load capacitance are connected to an output terminal to be measured (S25 and S26). In addition to the above condition, circuit information (D6) about a net list and constituent transistors in the measurement circuit shown in FIG. 9 is inputted to perform circuit simulations (S27). Waveform rounding information (D7) about the load capacitance is stored as the result of a simulation computation. This computation is carried out while the load capacitance and the number of wiring model stages are respectively being varied within predetermined ranges (S28 and S29).

After the computation in the predetermined range has been completed (S28: NO, S29: NO), an allowable longest wiring resistance RtL, an allowable longest wiring effective resistance RwL, and a capacitance-converted value CtL of RwL corresponding to wiring parameters are calculated based on the waveform rounding information (D7) placed under the computed respective conditions and waveform rounding limit information (D8) indicative of a drive limit. At this time, an interpolating expression or the like is derived or produced based on values computed with respect to discrete load capacitances to thereby determine these values (S30, S31 and S32). Namely, the relationship between RtL, RwL and CtL with respect to the predetermined range for the load capacitance is produced with the waveform roundings of the input signals as parameters (the relationship of RtL to CL is shown in FIG. 14).

The above-described computation is effected on a waveform rounding condition (S34) for each required input signal, and all the path conditions (S33) different in operating state, and the minimum values of RtL, RwL and CtL are respectively determined (S36) based on an interpolating expression or the like obtained from the execution of above computation, every output terminal (S35, S37: NO), and then set as wiring parameters.

Thus, the minimum drive capacity is selected among drive capacities at all the path conditions different in operating state under the respective load capacitances CL every output terminal. Accordingly, the respective output terminals are capable of reliably driving predetermined load capacitances under all the path conditions. It is further possible to prevent the re-action of layout wiring for a semiconductor integrated circuit device. Wiring parameters, which greatly contribute to the shortening of the period required to develop the semiconductor integrated circuit device, can be extracted.

The second specific example shown in FIG. 11 is one in which drive capacities for respective path conditions are calculated every output terminal, the waveform rounding of an input signal and a wiring load are changed for a path condition at which the minimum drive capacity is given, and the roundings of the signal waveforms are calculated every load capacitance to thereby extract wiring parameters.

Of respective steps and various data files shown in FIG. 11 those designated at the same reference numerals as those shown in the first specific example shown in FIG. 10 indicate functions similar to the wiring parameter extracting flow employed in the first specific example, and their description will therefore be omitted herein.

In the second specific example, the path conditions are first successively changed (S41, S43: YES) to thereby calculate a drive capacity (drive resistance value Rd) of an output terminal of a measurement circuit cell. Further, an input terminal condition library (D5) and a drive resistance value Rd library (D9) are brought into library form (S42). Upon extraction, a circuit cell to be measured is selected (S22), and an intended or target output terminal is selected (S44). A path condition corresponding to the minimum drive capacity (maximum drive resistance value Rd) at the target output terminal is selected based on the input terminal condition library (D5) and the drive resistance value Rd library (D9) (S45). Further, the waveform rounding of an input signal is set (S23). Circuit simulation are carried out while connections of wiring models used as loads and load capacitances are being changed (S25 through S29). Thereafter, an interpolating expression or the like is produced or derived and thereby the relationship between RtL, RwL and CtL with respect to a predetermined range of each load capacitance is produced with the waveform roundings of the input signals as parameters (S30 through S32). The above processing is executed for each output terminal (S46) as needed after the waveform rounding of the input signal is changed (S34), whereby the extraction of the parameters is completed.

In the second specific example, the circuit cell is fixed to the path condition indicative of the minimum drive capacity for each output terminal. The waveform rounding of each input terminal and the load capacitance CL can be changed to thereby obtain the drive limit of each output terminal. It is thus possible to limit computing conditions and shorten the time required to perform a process for extracting wiring parameters. This greatly contributes to the shortening of a period for the development of a semiconductor integrated circuit device.

The third specific example shown in FIG. 12 is one wherein the waveform roundings of input signals and load capacitances are changed at respective path conditions to calculate drive limits for each individual output terminals, and the minimum value of the drive limit is selected therefrom for each output terminal and extracted as a wiring parameter.

Of respective steps and various data files shown in FIG. 12, those designated at the same numerals as those shown in the first specific example shown in FIG. 10 respectively indicate functions similar to those in the wiring parameter extracting flow employed in the first specific example, and their description will therefore be omitted herein.

The selection of a circuit cell to be measured and the setting of each path condition from an input terminal condition library (D5) for all paths, the setting of the waveform rounding of each input signal, the connections of wiring models and load capacitances, and circuit simulations are similar to the first specific example (S21 through S27).

In the third specific example, it is determined whether the computed waveform rounding of each target signal reaches waveform rounding limit information (D8) indicative of a drive limit for each circuit simulation (S51). If it is found not to reach the limit value (S51: NO), then a load capacitance value is changed and a computing process is carried out again. When it has reached the limit value (S51: YES), a wiring resistance Rt and an effective resistance Rw of a wiring load both of which are calculated from each wiring model, are calculated (S52), and data about them are stored (D10). Here, Rw is an effective resistance calculated from the wiring models in FIG. 9. The effective resistance indicates the value of a resistive component obtained by calculating the sum of admittances as viewed from an output terminal where a wiring has no branch, and converting the wring models to a π-type wiring load model so as to become equivalent in delay time.

The wiring models are changed in number and this processing is repeated (S29: YES), whereby load capacitances indicative of drive limits are determined at respective wiring model values. RtL, RwL and CtL are determined from Rt and Rw at this time (D1O) (S30 through S32).

Subsequently, the waveform roundings of the input signals are changed as needed in a manner similar to the first specific example. Further, similar processing is effected every path condition to thereby calculate the minimum values of RtL, RwL and CtL with respect to each individual output terminals. Afterwards, the process for extracting the wiring parameters is completed (S33 through S37).

In the third specific example, the load capacitance CL is successively increased for each wiring load model with respect to the waveform rounding of a predetermined input signal at each path condition. The value of the wiring model at the time that the waveform rounding has reached the drive limit, can be determined as a drive limit value. It is thus possible to limit computing conditions and shorten the time required to perform a process for extracting wiring parameters. This greatly contributes to the shortening of a period for the development of a semiconductor integrated circuit device.

The fourth specific example shown in FIG. 13 is one in which drive capacities for respective path conditions are calculated every output terminal, the waveform rounding of an input signal and a load capacitance are changed with respect to a path condition at which the minimum drive capacity is given, and drive limits at the respective output terminals are calculated to thereby extract wiring parameters.

Of respective steps and various data files shown in FIG. 13, those designated at the same numerals as those shown in the second specific example shown in FIG. 11 and the third specific example shown in FIG. 12 respectively indicate functions similar to those in the wiring parameter extracting flow employed in the second or third specific example, and their description will therefore be omitted herein.

The fourth specific example illustrates a combined flow of the second specific example and the third specific example.

Namely, the minimum drive capacity (drive resistance value Rd) of each output terminal is calculated for each path condition. Further, a circuit cell to be measured is selected and its corresponding output terminal is selected. Afterwards, a path condition at which the minimum drive capacity is given, is selected, and the waveform rounding of an input signal is set. Further, wiring models and a load capacitance are connected to one another. The load capacitance is increased successively and circuit simulations are carried out in this condition. The above processing is executed every output terminal (S46) as needed after the waveform rounding of each input signal has been changed (S34) to thereby extract parameters. The above-described flow is similar to the second specific example (S22, S23, S25 through S27, S34, and S41 through S46).

Further, it is determined for each circuit simulation whether the waveform rounding of each computed target signal reaches waveform rounding limit information (D8) indicative of a drive limit. If it is found not to reach the limit value, then a load capacitance value is changed and a computing process is carried out again. When it has reached the limit value, a wiring resistance Rt and an effective resistance Rw of a wiring load both of which are calculated from each wiring model, are calculated. A load capacitance CL indicative of a drive limit is determined at each changed wiring model value. A flow for determining RtL, RwL and CtL from Rt and Rw at this time is similar to the third specific example (S29 through S32, S51 and S52).

In the fourth specific example, the circuit cell is fixed to the path condition indicative of the minimum drive capacity for each output terminal. Further, the load capacitance is successively increased for each wiring load model. The value of the wiring model at the time that the waveform rounding has reached the drive limit, can be determined as a drive limit value. It is thus possible to limit computing conditions to the required minimum and shorten the time required to perform a process for extracting wiring parameters. This greatly contributes to the shortening of a period for the development of a semiconductor integrated circuit device.

FIG. 14 typically shows the dependency of an allowable longest wiring resistance RtL at a circuit cell S, which is extracted from the wiring parameter extracting flow, on a load capacitance CL. FIG. 14(A) is a diagram showing a measuring circuit for extracting each wiring parameter, and FIG. 14(B) is a graph showing the result of extraction thereof. In FIG. 14(A), the circuit cell S is configured so as to have one output terminal OUT with respect to two input terminals IN1 and IN2. Let's now assume that the output terminal OUT serves so as to output the outputs of tri-state buffers Tri1 and Tri2 respectively driven from the input terminals IN1 and IN2 as wired-OR logic.

Upon the measurement of parameters, a waveform generator Sig is connected to the input terminals IN1 and IN2 by a selector switch SW1 between the circuit cell S and a GND potential corresponding to the waveform generator Sig. At this time, the terminal disconnected from the waveform generator Sig is fixed to a predetermined potential by an unillustrated bias circuit or the like in such a manner that the output of the tri-state buffer to be driven reaches a high-impedance state. Further, the waveform generator Sig has such a configuration as to be capable of variably adjusting a waveform rounding (Tin) of each signal waveform.

The allowable longest wiring resistance RtL is connected to the output terminal OUT as a load for a wiring L. Further, the load capacitance CL is connected as one indicative of an input load capacitance for a next-stage circuit cell. As load conditions under which each signal waveform at the load capacitance CL reaches a predetermined limit value, graphs obtained by extracting allowable longest wiring resistances RtL with respect to the load capacitance CL with waveform roundings of input signals as parameters are shown in FIG. 14(B).

In the graphs shown in FIG. 14(B), a drive limit characteristic of the single buffer Tri1 connected to the input terminal IN1 is indicated by chain lines 11, whereas a characteristic of the single buffer Tri2 accompanied by the input terminal IN2 is indicated by dotted lines 12. The two indicate negative dependence with respect to the waveform rounding of each input signal. As the waveform rounding of the input signal is large and the rounding of each input signal waveform becomes great, a drivable load becomes small. Further, the relationship between the load capacitance CL and the allowable longest wiring resistance RtL also indicates negative dependence. As the load capacitance CL increases, the allowable longest wiring resistance RtL becomes small. However, this dependency varies according to an internal circuit configuration of the circuit cell S, the configuration of a buffer, etc. The buffer Tri2 shows weak dependency as indicated by the dotted lines 12 as compared with the buffer Tri1 having strong dependency indicated by the chain lines 11.

When allowable longest wiring resistances RtL with respect to the load capacitance CL are calculated for the circuit cell S having the above characteristics according to the wiring parameter extracting flow of the first specific example, a characteristic indicated by solid lines in the graphs is obtained. Namely, the minimum value of the characteristics indicated by the chain lines 11 and dotted lines 12 results in the characteristic of an allowable longest wiring resistance RtL at the output terminal OUT of the circuit cell S according to the process S36 of FIG. 10 for extracting the minimum value of each individual characteristics.

Thus, the relationship between a load capacitance and an allowable longest wiring length at which the output terminal OUT of the circuit cell Scan reliably be driven, can be obtained. Accordingly, a circuit cell-to-circuit cell layout wiring can be achieved in which the next-stage circuit cell can be driven within a predetermined signal waveform rounding limit value, and a period for the development of a semiconductor integrated circuit device can be shortened.

In the method of designing the semiconductor integrated circuit device, according to the present embodiment and the apparatus for designing the same, as described above in detail, the determination part (C1) made up of S2 through S6 and used to make the wiring drive decision compares the wiring path resistance Rpath from the target output terminal of the target circuit cell to the next-stage circuit cell to be driven with the allowable longest wiring resistance RtL at the target circuit cell in S4 according to the circuit cell layout control flow (FIG. 4). When Rpath is less than or equal to RtL in all the wiring paths (S4: YES), the determination part proceeds to S5, where the sum Rtotal of the resistances of the wiring loads in the net and RtL are compared. If Rtotal is less than or equal to RtL (S5: YES), then the next-stage circuit cell is judged to be drivable within the predetermined waveform rounding limit value. When Rtotal is greater than RtL (S5: NO), the determination part proceeds to S6, where the effective resistance Rw of the wiring load and the allowable longest wiring effective resistance RwL are compared. When Rw is less than or equal to RwL (S6: YES), the waveform rounding at the next stage is judged to fall within the predetermined limit value.

Accordingly, a decision as to whether the roundings of the waveforms of the signals inputted to the next-stage circuit cells EA, EB and EC respectively fall within a predetermined limit value, can be made without executing the calculation of delays in the propagation of the signal waveforms on the wiring paths LA, LB and LC upon layout wiring of the circuit cells S, EA, EB and EC. Thus, the specifications related to signal propagation delays and operating timings can be ensured with satisfactory accuracy and reliably.

In order to produce wiring information (D2), it is not always necessary to set even detailed layout wiring between circuit cells. The wiring information can be estimated even from circuit information at logic composition, approximate values of the lengths of connected wirings, which are obtained from a rough layout of circuit cells, etc. If information close to an actual semiconductor integrated circuit device layout such as the detailed layout wiring between the circuit cells is offered, then the layout wiring between the circuit cells, which satisfies a waveform rounding limit, can be carried out with a high degree of accuracy. If the circuit information at the logic composition and the approximate values of the lengths of the connected wirings, which are obtained from the rough layout of the circuit cells, are utilized, then the specifications for limiting waveform roundings caused by the layout of the semiconductor integrated circuit device can accurately be grasped at an early stage of the design of the semiconductor integrated circuit device. It is also possible to prevent the re-action or the like of the layout wiring beforehand and shorten a development period.

Further, if information close to an actual semiconductor integrated circuit device layout such as detailed layout wiring between circuit cells is offered, then layout wiring between the circuit cells, which satisfies a waveform rounding limit, can be carried out with high accuracy.

In addition to the above, characteristic variations due to hot carriers easy to develop as the waveform rounding becomes large, and the influence of peripheral noise such as crosstalk noise can reliably be prevented at the early stage of the development of the semiconductor integrated circuit device. Thus, the handling of an increase in the reliability of the semiconductor integrated circuit device and an improvement in operating performance thereof can be taken early and reliably, and the quality of the semiconductor integrated circuit device can be improved.

When wiring parameters such as an allowable longest wiring resistance RtL, an allowable longest wiring effective resistance RwL and a capacitance-converted value CtL of RwL, etc. with respect to waveform roundings of input signals to respective circuit cells and an input load capacitance of each next-stage circuit cell are extracted according to circuit simulations, based on the measuring circuit for the extraction of the wiring parameters (FIG. 9), the waveform roundings of the input signals and a wiring load are changed under respective path conditions. Further, the roundings of signal waveforms every load capacitance are calculated. According to the first specific example (FIG. 10) for selecting the minimum values indicative of drive limits every output terminal among the above-calculated ones and extracting them as wiring parameters, the minimum drive capacity is selected among drive capacities at all the path conditions different in operating state under the respective load capacitances CL every output terminal. Accordingly, the respective output terminals are capable of extracting wiring parameters which make it possible to reliably drive predetermined load capacitances at all the path conditions.

Further, drive capacities at respective path conditions are calculated every output terminal, and the waveform rounding of each input signal and a wiring load are changed for a path condition at which the minimum drive capacity is given. According to the second specific example (FIG. 11) for calculating the roundings of the signal waveforms every load capacitance to thereby extract wiring parameters, the circuit cell is fixed to the path condition indicative of the minimum drive capacity for each output terminal. The waveform rounding of each input terminal and the load capacitance CL are changed to thereby make it possible to determine the drive limit of each output terminal. It is thus possible to limit computing conditions and shorten the time required to perform a process for extracting wiring parameters, whereby the shortening of a period for the development of a semiconductor integrated circuit device can be achieved.

Waveform roundings of input signals and each load capacitance are changed at respective path conditions to calculate drive limits for each individual out put terminals. According to the third specific example (FIG. 12) for selecting the minimum value of the drive limit therefrom for each output terminal and extracting it as the wiring parameter, the load capacitance CL is successively increased for each wiring load model with respect to the predetermined waveform rounding of a input signal at each path condition, and the value of each wiring model at the time that the waveform rounding has reached the drive limit, can be determined as a drive limit value. It is thus possible to limit computing conditions and shorten the time required to perform a process for extracting wiring parameters. Hence the shortening of a period for the development of a semiconductor integrated circuit device can be achieved.

Drive capacities for respective path conditions are calculated every output terminal. Further, the waveform rounding of each input signal and a load capacitance are changed with respect to a path condition at which the minimum drive capacity is given. According to the fourth specific example (FIG. 13) for calculating drive limits at the respective output terminals to thereby extract wiring parameters, the circuit cell is fixed to the path condition indicative of the minimum drive capacity for each output terminal. Further, the load capacitance is successively increased for each wiring load model. The value of the wiring model at the time that the waveform rounding has reached the drive limit, can be determined as a drive limit value. It is thus possible to limit computing conditions to the required minimum and shorten the time required to perform a process for extracting wiring parameters. Hence the shortening of a period for the development of a semiconductor integrated circuit device can be achieved.

Incidentally, the present invention is not limited to the above embodiments. It is needless to say that various improvements and modifications can be made thereto within the scope not departing from the substance thereof.

For example, the present embodiment has described, as an example, the case in which a decision as to whether each signal waveform falls within the waveform rounding limit value, is made based on the resistance RtL of the allowable longest wiring and the effective resistance RwL thereof. The present invention is not limited to it. The present embodiment may be configured based on the capacitance-converted value CtL of the allowable longest wiring effective resistance RwL.

According to the present invention, a method of and an apparatus for designing a semiconductor integrated circuit device can be provided which are capable of causing each waveform rounding to fall within a predetermined limit value and thereby assuring circuit operations for the semiconductor integrated circuit device without making delay calculations at an early stage of the development of the semiconductor integrated circuit device.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A method of designing a semiconductor integrated circuit device, which lays out and wires a circuit cell group according to net information, comprising:

a longest wiring load calculating operation for calculating a wiring load of a drivable allowable longest wiring having taken into consideration a waveform rounding, as a first load for each load capacitance driven by the circuit cell;

a wiring load estimating operation for calculating, an input load capacitance of a next-stage circuit cell and a second load estimated as a wiring load from the circuit cell to the next-stage circuit cell; and a determining operation for comparing the first load related to the load capacitance corresponding to the input load capacitance, and the second load and judging a signal inputted to the next-stage circuit cell to be less drivable when the second load is smaller than the first load.

2. The method according to claim 1, wherein the first load includes a first resistance corresponding to the resistance of the allowable longest wiring, the second load includes a second resistance corresponding to the resistance of a wiring path for connecting the circuit cell and the next-stage circuit cell, and a third resistance corresponding to the sum of resistances of all wiring loads driven by the circuit cell, and the determining operation compares the first resistance and the second resistance or the third resistance, and judges the signal waveform to be less than or equal to the predetermined waveform rounding limit value when the second resistance or the third resistance is smaller than the first resistance.

3. The method according to claim 1, wherein the longest wiring load calculating operation includes the calculation of a first wiring load parameter upon conversion to a first wiring load model based on the first load and the load capacitance, the wiring load estimating operation includes the calculation of a second wiring load parameter upon conversion to a second wiring load model based on the second load and the input load capacitance connected to the second load, and the determining operation compares the first wiring load parameter and the second wiring load parameter and judges the signal waveform to be less than or equal to a predetermined waveform rounding limit value when the second wiring load parameter is smaller than the first wiring load parameter.

4. The method according to claim 3, wherein the first load includes a first resistance corresponding to the resistance of the allowable longest wiring and a first capacitance corresponding to a load capacitance on the allowable longest wiring, the first wiring load model is a π-type wiring load model converted to a wiring load model based on the first resistance, the first capacitance and the load capacitance, the first wiring load parameter is a fourth resistance modeled by the first wiring load model, the second load includes a second resistance corresponding to resistances of all wiring paths for connecting the circuit cell and the next-stage circuit cells and a second capacitance corresponding to load capacitances on all the wiring paths, the second wiring load model is a wiring load model obtained by converting a wiring having branches to a π-type wiring load model by a predetermined approximation method, and the second wiring load parameter is a fifth resistance modeled by the second wiring load model.

5. The method according to claim 1, wherein the first load includes a first resistance corresponding to the resistance of the allowable longest wiring, the second load includes a second resistance corresponding to the resistance of a wiring path for connecting the circuit cell and the next-stage circuit cell, and a third resistance corresponding to the sum of resistances of all the wiring loads driven by the circuit cell, the determining operation compares the first resistance and the second resistance or the third resistance, and judges the signal waveform to be greater than or equal to a predetermined waveform rounding limit value when the second resistance or the third resistance is larger than the first resistance, the longest wiring load calculating operation includes the calculation of a first wiring load parameter upon conversion to a first wiring load model based on the first load and the load capacitance, the wiring load estimating operation includes the calculation of a second wiring load parameter upon conversion to a second wiring load model based on the second load and the input load capacitance connected to the second load, and the determining operation compares the first wiring load parameter and the second wiring load parameter and judges the signal waveform to be less than or equal to the predetermined waveform rounding limit value when the second wiring load parameter is smaller than the first wiring load parameter.

6. The method according to claim 5, wherein the first load includes a first resistance corresponding to the resistance of the allowable longest wiring and a first capacitance corresponding to a load capacitance on the allowable longest wiring, the first wiring load model is a π-type wiring load model converted to a wiring load model based on the first resistance, the first capacitance and the load capacitance, the first wiring load parameter is a fourth resistance modeled by the first wiring load model, the second load includes a second resistance corresponding to resistances of all wiring paths for connecting the circuit cell and the next-stage circuit cells and a second capacitance corresponding to load capacitances on all the wiring paths, the second wiring load model is a wiring load model obtained by converting a wiring having branches to a π-type wiring load model by a predetermined approximation method, and the second wiring load parameter is a fifth resistance modeled by the second wiring load model.

7. The method according to claim 1, wherein the longest wiring load calculating operation comprises an individual longest load calculating operation for calculating, as a third load, a wiring load at the time that a waveform rounding of a signal waveform driven by each output terminal under each individual input terminal condition of the circuit cell reach a predetermined waveform rounding limit value, every load capacitance with respect to the each output terminal, and a selecting operation for selecting the minimum value among the third loads calculated under the respective input terminal conditions, every load capacitance with respect to the each output terminal, and setting the same as the first load corresponding to the each load capacitance at each of the output terminals.

8. The method according to claim 7, wherein the waveform rounding of a signal inputted to the circuit cell is set to a predetermined time.

9. The method according to claim 1, wherein the longest wiring load calculating operation calculates a wiring load at the time that a waveform rounding of a signal waveform reach a predetermined waveform rounding limit value, as a first load corresponding to the respective load capacitance at the output terminal according to an input terminal condition under which drive capacities are minimized every output terminal of the circuit cell.

10. The method according to claim 9, wherein the waveform rounding of a signal inputted to the circuit cell is set to a predetermined time.

11. The method according to claim 1, wherein, in the determining operation, a waveform of the signal inputted to the next-stage circuit cell is judged to have an allowable waveform.

12. An apparatus for designing a semiconductor integrated circuit device, which lays out and wires a circuit cell group according to net information, comprising:

longest wiring load calculating unit for calculating a wiring load of a drivable allowable longest wiring having taken into consideration a waveform rounding, as a first load for each load capacitance driven by the circuit cell;

wiring load estimating unit for calculating an input load capacitance of a next-stage circuit cell and a second load estimated as a wiring load from the circuit cell to the next-stage circuit cell; and determining unit for comparing the first load related to the load capacitance corresponding to the input load capacitance, and the second load and judging a signal inputted to the next-stage circuit cell to be drivable when the second load is smaller than the first load.

13. The apparatus according to claim 12, wherein the longest wiring load calculating unit comprises individual longest load calculating unit for calculating, as a third load, a wiring load at the time that a waveform rounding of a signal waveform driven by each output terminal under each individual input terminal condition of the circuit cell reach a predetermined waveform rounding limit value, every load capacitance with respect to the respective output terminal, and selecting unit for selecting the minimum value among the third loads calculated under the respective input terminal conditions, every load capacitance with respect to the respective output terminal, and setting the same as the first load corresponding to each load capacitance at each of the output terminals.

14. A recording medium having programs recorded therein for implementing the method of designing the semiconductor integrated circuit device, the medium controlling a computer by performing:

a longest wiring load calculating operation calculating a wiring load of a drivable allowable longest wiring having taken into consideration a waveform rounding, as a first load for each load capacitance driven by the circuit cell;

a wiring load estimating operation calculating, an input load capacitance of a next-stage circuit cell and a second load estimated as a wiring load from the circuit cell to the next-stage circuit cell; and a determining operation comparing the first load related to the load capacitance corresponding to the input load capacitance, and the second load in size, and judging a signal waveform inputted to the next-stage circuit cell to be less than or equal to a predetermined waveform rounding limit value and drivable when the second load is smaller than the first load.

15. A method of designing a semiconductor integrated circuit device, which lays out and wires a circuit cell group according to net information, comprising:

a longest wiring load calculating operation for calculating a wiring load of a drivable allowable longest wiring having taken into consideration a waveform rounding, as a first load for each load capacitance driven by the circuit cell;

a wiring load estimating operation for calculating an input load capacitance of a next-stage circuit cell and a second load estimated as a wiring load from the circuit cell to the next-stage circuit cell; and a determining operation for comparing the first load related to the load capacitance corresponding to the input load capacitance, and the second load, and judging a delay for changing of the signal inputted to the next-stage circuit cell to be within an allowable time when the second load is smaller than the first load.

16. A method of designing a semiconductor integrated circuit device, which lays out and wires a circuit cell group according to net information, comprising:

a longest wiring load calculating operation for calculating a wiring load of a drivable allowable longest wiring having taken into consideration a waveform rounding, as a first load for each load capacitance driven by the circuit cell;

a wiring load estimating operation for calculating an input load capacitance of a next-stage circuit cell and a second load estimated as a wiring load from the circuit cell to the next-stage circuit cell; and a determining operation for comparing the first load related to the load capacitance corresponding to the input load capacitance, and the second load, wherein a waveform of the signal inputted to the next-stage circuit cell has a waveform to be able to drive the next-stage circuit cell when the second load is smaller than the first load.

17. An apparatus for designing a semiconductor integrated circuit device, which lays out and wires a circuit cell group according to net information, comprising:

longest wiring load calculating unit for calculating a wiring load of a drivable allowable longest wiring having taken into consideration a waveform rounding, as a first load for each load capacitance driven by the circuit cell;

wiring load estimating unit for calculating an input load capacitance of a next-stage circuit cell and a second load estimated as a wiring load form the circuit cell of the next-stage circuit cell; and determining unit for comparing the first load related to the load capacitance corresponding to the input load capacitance, and the second load, and judging a delay time for changing of the signal inputted to the next-stage circuit cell to be within an allowable time when the second load is smaller than the first load.

18. An apparatus for designing a semiconductor integrated circuit device, which lays out and wires a circuit cell group according to net information, comprising:

longest wiring load calculating unit for calculating a wiring load of a drivable allowable longest wiring having taken into consideration a waveform rounding, as a first load for each load capacitance driven by the circuit cell;

wiring load estimating unit for calculating an input load capacitance of a next-stage circuit cell and a second load estimated as a wiring load from the circuit cell to the next-stage circuit cell; and determining unit for comparing the first load related to the load capacitance corresponding to the input load capacitance, and the second load, wherein a waveform of the signal inputted to the next-stage circuit cell has a waveform to be able to drive the next-stage circuit when the second load is smaller than the first load.

* * * * *